US011475955B2

(12) United States Patent
Lee et al.

(10) Patent No.: US 11,475,955 B2
(45) Date of Patent: Oct. 18, 2022

(54) MULTI-CHIP PACKAGE WITH REDUCED CALIBRATION TIME AND ZQ CALIBRATION METHOD THEREOF

(71) Applicant: Samsung Electronics Co., Ltd., Suwon-si (KR)

(72) Inventors: Junha Lee, Seoul (KR); Seonkyoo Lee, Hwaseong-si (KR); Jeongdon Ihm, Seongnam-si (KR); Byunghoon Jeong, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 17/393,784

(22) Filed: Aug. 4, 2021

(65) Prior Publication Data

US 2021/0366546 A1 Nov. 25, 2021

Related U.S. Application Data

(62) Division of application No. 16/834,025, filed on Mar. 30, 2020, now Pat. No. 11,127,462.

(30) Foreign Application Priority Data

Sep. 3, 2019 (KR) .......................... 10-2019-0108936

(51) Int. Cl.
*G11C 16/06* (2006.01)
*H01L 23/66* (2006.01)
(Continued)

(52) U.S. Cl.
CPC .............. *G11C 16/06* (2013.01); *H01L 23/66* (2013.01); *H01L 25/0657* (2013.01);
(Continued)

(58) Field of Classification Search
CPC ......... G11C 16/06; G11C 5/04; G11C 7/1084; G11C 7/1093; G11C 29/00; G11C 7/1057;
(Continued)

(56) References Cited

U.S. PATENT DOCUMENTS 6,492,853 B1 12/2002 Latham et al.
7,194,559 B2 3/2007 Salmon et al.
(Continued)

FOREIGN PATENT DOCUMENTS

CN 107527650 A * 12/2017 ......... G11C 11/4074
CN 109891586 A * 6/2019 ........... G11C 29/022
(Continued)

OTHER PUBLICATIONS

Extended European Search Report dated Nov. 9, 2020 for corresponding European Application No. 20184824.9.
(Continued)

*Primary Examiner* — Fernando Hidalgo
(74) *Attorney, Agent, or Firm* — Harness, Dickey & Pierce, P.L.C.

(57) ABSTRACT

A multi-chip package with reduced calibration time and an impedance control (ZQ) calibration method thereof are provided. A master chip of the multi-chip package performs a first ZQ calibration operation by using a ZQ resistor, and then, the other slave chips simultaneously perform second ZQ calibration operations with respect to data input/output (DQ) pads of the slave chips by using a termination resistance value of a DQ pad of the master chip on the basis of a one-to-one correspondence relationship with the DQ pad of the master chip. The multi-chip package completes ZQ calibration by performing two ZQ calibration operations, thereby decreasing a ZQ calibration time.

14 Claims, 15 Drawing Sheets

(51) Int. Cl.
  *H01L 25/065*  (2006.01)
  *H01L 25/18*   (2006.01)
  H01L 23/00    (2006.01)

(52) U.S. Cl.
  CPC .............. *H01L 25/18* (2013.01); *H01L 24/48* (2013.01); *H01L 2223/6611* (2013.01); *H01L 2224/48091* (2013.01); *H01L 2224/48106* (2013.01); *H01L 2224/48145* (2013.01); *H01L 2224/48235* (2013.01); *H01L 2225/0651* (2013.01); *H01L 2225/06506* (2013.01); *H01L 2225/06562* (2013.01); *H01L 2225/06586* (2013.01); *H01L 2924/14511* (2013.01)

(58) Field of Classification Search
  CPC ....... G11C 7/10; G11C 7/1006; G11C 7/1048; H01L 23/66; H01L 25/0657; H01L 25/18; H01L 24/48; H01L 2223/6611; H01L 2224/48091; H01L 2224/48106; H01L 2224/48145; H01L 2224/48235; H01L 2225/06506; H01L 2225/0651; H01L 2225/06562; H01L 2225/06586; H01L 2924/14511; H01L 24/49; H01L 2224/49109; H01L 2224/32145; H01L 2224/32225; H01L 2224/48137; H01L 2224/73265; H01L 2225/06548; H01L 2924/15311; H01L 25/0652; H04L 25/0278
  USPC .................................................... 365/185.17
  See application file for complete search history.

(56) References Cited

U.S. PATENT DOCUMENTS

| | | | |
|---|---|---|---|
| 7,679,133 B2 | 3/2010 | Son et al. | |
| 7,728,619 B1 | 6/2010 | Tzou et al. | |
| 8,488,381 B2 | 7/2013 | Kim et al. | |
| 8,553,466 B2 | 10/2013 | Han et al. | |
| 8,559,235 B2 | 10/2013 | Yoon et al. | |
| 8,654,587 B2 | 2/2014 | Yoon et al. | |
| 8,917,110 B2 | 12/2014 | Ko | |
| 8,937,488 B2 | 1/2015 | Riho | |
| 9,548,316 B2 | 1/2017 | Lim et al. | |
| 9,666,289 B2 | 5/2017 | Lee et al. | |
| 9,805,769 B2 | 10/2017 | Lee et al. | |
| 9,825,631 B1 | 11/2017 | Cho et al. | |
| 9,917,061 B2 | 3/2018 | Byeon | |
| 10,090,064 B2 | 10/2018 | Pan | |
| 10,255,969 B2 | 4/2019 | Eom et al. | |
| 10,276,220 B2 | 4/2019 | Jeon et al. | |
| 2011/0233648 A1 | 9/2011 | Seol et al. | |
| 2014/0334232 A1 | 11/2014 | Nam et al. | |
| 2017/0099050 A1* | 4/2017 | Lee ...................... | G11C 7/1057 |
| 2017/0288647 A1* | 10/2017 | Shekhar .............. | H01L 23/5382 |
| 2018/0158809 A1 | 6/2018 | Kim et al. | |
| 2018/0277216 A1* | 9/2018 | Inoue ..................... | G11C 16/26 |
| 2019/0080784 A1* | 3/2019 | Kim .................... | G06F 13/1668 |
| 2019/0158320 A1 | 5/2019 | Kwon et al. | |
| 2020/0227117 A1* | 7/2020 | Inoue .................. | G11C 7/1057 |

FOREIGN PATENT DOCUMENTS

| | | |
|---|---|---|
| KR | 10-0974224 B1 | 8/2010 |
| KR | 10-2018-0065228 A | 6/2018 |

OTHER PUBLICATIONS

Notice of Allowance dated May 21, 2021, issued in corresponding U.S. Appl. No. 16/834,025.

Office action dated Aug. 9, 2021, issued in corresponding U.S. Appl. No. 17/012,845.

Notice of Allowance dated Aug. 23, 2021, issued in corresponding U.S. Appl. No. 17/012,845.

* cited by examiner

MULTI-CHIP PACKAGE WITH REDUCED CALIBRATION TIME AND ZQ CALIBRATION METHOD THEREOF

CROSS-REFERENCE TO RELATED APPLICATION

This application claims the benefit of U.S. application Ser. No. 16/834,025, filed on Mar. 30, 2020 and Korean Patent Application No. 10-2019-0108936, filed on Sep. 3, 2019, in the Korean Intellectual Property Office, the disclosure of each of which is incorporated herein in its entirety by reference.

BACKGROUND

1. Field

At least some example embodiments of the inventive concepts relate to a semiconductor device, and more particularly, to a multi-chip package in which a ZQ calibration operation is performed twice. For example, a master chip of a plurality of memory chips in the multi-chip package performs a ZQ calibration operation and then the other slave chips perform ZQ calibration operations simultaneously, thereby decreasing a calibration time.

2. Related Art

Electronic devices include a plurality of semiconductor integrated circuits (or semiconductor chips) and have a complicated hardware configuration. According to the demand for miniaturization and weigh reduction of electronic devices, a multi-chip package including a plurality of semiconductor chips equipped in one package has been provided for decreasing the number of elements mounted in electronic devices. Also, a swing width of each signal is reduced for minimizing a transfer time of each of the signals transmitted between semiconductor chips. As a swing width of each signal is reduced, an influence of external noise on semiconductor chips increases, and signal reflection caused by an impedance mismatch is severe in an interface. In order to solve the impedance mismatch, semiconductor chips include a ZQ pin and receive a ZQ calibration command from the outside to perform the ZQ calibration operation, thereby controlling the impedance mismatch.

As high-capacity memory is needed, multi-chip packages wherein a plurality of memory chips (or dies) operating independently through different channels are equipped in one package are provided. In a multi-chip package channel, each memory chip performs the ZQ calibration operation on signal lines through which a command, an address, and data of a corresponding memory chip are transferred. In this case, the ZQ calibration operation has to be performed a plurality of times equal to the number of memory chips equipped in a multi-chip package. For example, when eight memory chips are equipped in a multi-chip package, the ZQ calibration operation has to be performed eight times, and each of the eight memory chips has to complete the ZQ calibration operation during a ZQ calibration time defined in the package specification.

However, in a case where the ZQ calibration operation has to be performed a plurality of times equal to the number of memory chips equipped in a multi-chip package, a ZQ calibration command has to be sequentially input to each of the memory chips, and a time taken in waiting for sequentially performing the ZQ calibration operation based on a calibration command of a corresponding memory chip is too long.

SUMMARY

At least some example embodiments of the inventive concepts provide a multi-chip package and a ZQ calibration method thereof, in which a ZQ calibration operation is performed twice. For example, a master chip of a plurality of memory chips of the multi-chip package performs a ZQ calibration operation once and the other slave chips simultaneously perform ZQ calibration operations once, thereby decreasing a calibration time.

A multi-chip package includes a printed circuit board; and a plurality of memory chips stacked on the printed circuit board and including a master memory chip and a plurality of slave memory chips, each of the plurality of memory chips including an impedance control (ZQ) pad and a plurality of data input/output (DQ) pads, wherein the master memory chip is configured to perform a first ZQ calibration operation with respect to a ZQ pad of the master memory chip by using a ZQ resistor connected to a ZQ terminal of the multi-chip package and control termination resistance values of the DQ pads of the master memory chip on the basis of a result of the first ZQ calibration operation, and each slave memory chip from among the plurality of slave chips is configured to perform second ZQ calibration operations with respect to DQ pads of first to $m^{th}$ slave memory chips from among the plurality of slave memory chips by using termination resistance values of first to $m^{th}$ DQ pads from among the plurality of DQ pads of the master memory chip on the basis of a ZQ calibration option set between the first to $m^{th}$ DQ pads of the master memory chip and DQ pads of the first to $m^{th}$ slave memory chips, m being an integer greater than 1.

A multi-chip package includes a printed circuit board; a buffer chip on the printed circuit board, the buffer chip including a first impedance control (ZQ) pad and first data input/output (DQ) pads; and a plurality of memory chips stacked on the printed circuit board and arranged apart from the buffer chip, each of the plurality of memory chips including a second ZQ pad and second DQ pads, wherein the buffer chip is configured to perform a first ZQ calibration operation with respect to the first ZQ pad by using a ZQ resistor connected to the first ZQ pad, and to control termination resistance values of the first DQ pads of the buffer chip on the basis of a result of the first ZQ calibration operation, and wherein each of the plurality of memory chips is configured to perform second ZQ calibration operations with respect to the second DQ pads of a corresponding memory chip from among the plurality of memory chips by using a termination resistance value of a corresponding DQ pad of the buffer chip on the basis of a ZQ calibration option set between the first DQ pads of the buffer chip and the second DQ pads of the corresponding memory chip.

According to at least some example embodiments of the inventive concepts, there is provided an impedance control (ZQ) calibration method of a multi-chip package including a plurality of memory chips, the ZQ calibration method including performing a first ZQ calibration operation with respect to a ZQ pad by using a ZQ resistor connected to the ZQ pad in a master memory chip of the plurality of memory chips, controlling termination resistance values of data input/output (DQ) pads of the master memory chip on the basis of a result of the first ZQ calibration operation in the master memory chip, and performing second ZQ calibration operations with respect to DQ pads of first to $m^{th}$ slave memory chips by using termination resistance values of first to $m^{th}$ DQ pads of the master memory chip on the basis of a ZQ calibration option set between the DQ pads of the master memory chip and the DQ pads of the slave memory chips in each of slave memory chips, other than the master memory chip, of the plurality of memory chips.

According to at least some example embodiments of the inventive concepts, there is provided an impedance control (ZQ) calibration method of a multi-chip package including a plurality of memory chips, the ZQ calibration method including performing a first ZQ calibration operation with respect to a ZQ pad of a buffer chip by using a ZQ resistor connected to a ZQ terminal of the multi-chip package in the buffer chip of the multi-chip package, controlling termination resistance values of data input/output (DQ) pads of the buffer chip on the basis of a result of the first ZQ calibration operation in the buffer chip, and performing second ZQ calibration operations with respect to DQ pads of a corresponding memory chip by using a termination resistance value of a corresponding DQ pad of the buffer chip on the basis of a ZQ calibration option set between the DQ pads of the buffer chip and the DQ pads of the corresponding memory chip in each of the plurality of memory chips.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
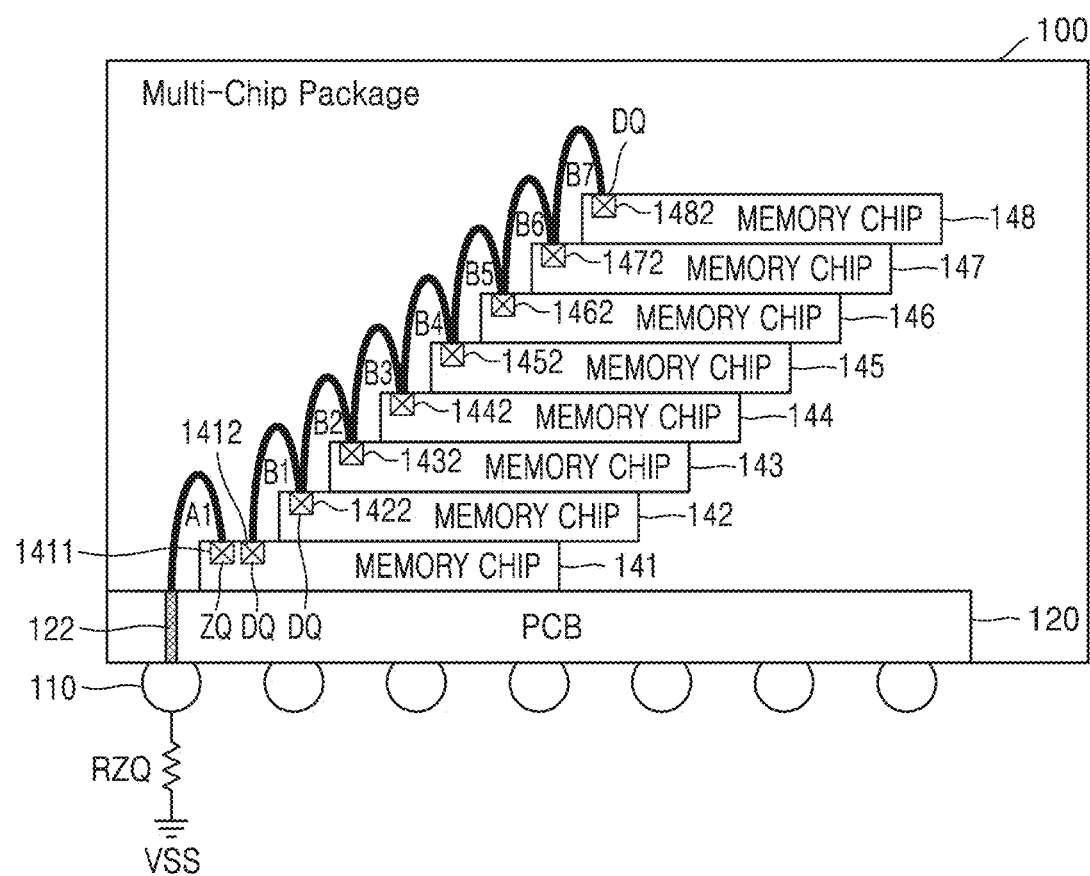
FIG. 1 is a diagram for describing a multi-chip package according to at least one example embodiment of the inventive concepts.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

FIG. 1 is a diagram for describing a multi-chip package 100 according to at least one example embodiment of the inventive concepts.

Referring to FIG. 1, the multi-chip package 100 may include a plurality of memory chips 141 to 148 stacked on a printed circuit board (PCB) 120. The PCB 120 may include a plurality of conductive layers and through-silicon vias (TSVs) 122, which are separated from one another by an insulation layer. The conductive layers and the TSVs 122 of the PCB 120 may be connected to external terminals 110 of the multi-chip package 100. For example, the external terminals 110 of the multi-chip package 100 may be implemented as package balls or package leads.

In some embodiments, the terms "connected" and "coupled" may be described along with a derivative thereof. The terms may not be intended as synonyms. For example, description using the terms "connected" and/or "coupled" may represent that two or more elements contact one another directly and physically or electrically. Also, the term "coupled" may denote that two or more elements do not directly contact one another but still collaborate or cooperate with one another.

The multi-chip package 100 may be implemented as, for example, a package on package (PoP), ball grid arrays (BGA), chip scale package (CSP), plastic leaded chip carrier (PLCC), plastic dual in-line package (PDIP), die in waffle pack, die in wafer form, chip on board (COB), CERamic dual in-line package (CERDIP), metric quad flat package (MQFP), thin quad flat pack (TQFP), small outline (SOIC), shrink small outline package (SSOP), thin small outline (TSOP), system in package (SIP), multi-chip package (MCP), wafer-level fabricated package (WFP), or wafer-level processed stack package (WSP).

The multi-chip package 100 may be a memory system including high-capacity and high-speed memory chips. The memory chips 141 to 148 may each be implemented as non-volatile memory devices. In a non-limiting embodiment, the non-volatile memory devices may include flash memory, phase change random access memory (PRAM), resistance random access memory (RRAM), magnetic random access memory (MRAM), ferroelectric random access memory (FRAM), electrically erasable programmable read-only memory (EEPROM), nano floating gate memory (NFGM), and polymer random access memory (PoRAM). In some embodiments, a multi-chip package 1000 (see FIG. 10) may include solid state drive (SSD), embedded universal flash storage (UFS) memory card, embedded multi-media card (eMMC), compact flash (CF), secure digital (SD), micro secure digital (Micro-SD), mini secure digital (Mini-SD), extreme digital (xD), or memory stick, which includes a buffer chip (or a memory controller) for controlling non-volatile memory chips and volatile memory chips.

According to at least one example embodiment of the inventive concepts, the memory chips 141 to 148 may each be configured to include a plurality of volatile memory devices. In a non-limiting embodiment, the volatile memory devices may include dynamic random access memory (DRAM), static random access memory (SRAM), mobile DRAM, double data rate synchronous dynamic random access memory (DDR SDRAM), low power DDR (LPDDR) SDRAM, graphic DDR (GDDR) SDRAM, and Rambus dynamic random access memory (RDRAM). In some embodiments, the multi-chip package 100 may be a DRAM multi-chip package (MCP) or a high bandwidth memory (HBM).

According to at least one example embodiment of the inventive concepts, the memory chips 141 to 148 may each be configured with different kinds of memory devices including non-volatile memory devices and volatile memory devices. Hereinafter, an example where each of the memory chips 141 to 148 is a NAND flash memory (e.g., a NAND non-volatile memory device) will be described, but the technical spirit of the present disclosure is not limited thereto.

Each of the memory chips 141 to 148 may be configured with a NAND flash memory. The NAND flash memory may include a memory cell array including memory cells which are arranged in rows (word lines) and columns (bit lines). Each of the memory cells may store 1-bit (single data) data or M-bit (multi-bit) data (where M is an integer of 2 or more). Each memory cell may be implemented as a memory cell, including a charge storage layer such as a charge trap layer or a floating gate, or a memory cell including a variable resistor.

The memory cell array may be implemented to have a single-layer array structure (or a two-dimensional (2D) array structure) or a multi-layer array structure (or a three-dimensional (3D) array structure). A 3D memory array may be a circuit that includes an active area disposed on a silicon substrate and is associated with an operation of each of memory cells, and may be configured in a monolithic type on a physical level of at least one of memory cell arrays each including a circuit which is provided on or in the substrate. The monolithic type may denote that layers of levels configuring the array are stacked just on layers of lower levels of the array.

In an embodiment, the 3D memory array may include a plurality of NAND strings which are arranged in a vertical direction in order for at least one memory cell to be disposed on another memory cell. The at least one memory cell may include a charge trap layer. U.S. Pat. Nos. 7,679,133, 8,553,466, 8,654,587 and 8,559,235 and U.S. Patent Application No. 2011/0233648 disclose appropriate elements of a 3D memory cell array which include a plurality of levels and in which word lines and/or bit lines are shared between the plurality of levels. In the present specification, the reference documents may be incorporated herein by reference. Also, U.S. Patent Application No. 2014-0334232 and U.S. Pat. No. 8,488,381 may be incorporated herein by reference. According to at least some example embodiments of the inventive concepts, 100 or more stacked word lines may be provided in a vertical NAND channel of the 3D memory array.

In other embodiments, the 3D memory array may have a cell over peri (COP) structure. The COP structure may denote a structure where memory cell structures are stacked on a peripheral circuit, and each of the memory cell structures may include a channel which extends in a direction vertical to an upper surface of a silicon substrate. U.S. Pat. Nos. 9,666,289 and 9,548,316 disclose appropriate elements of the COP structure. In the present specification, the reference documents may be incorporated herein by reference.

The multi-chip package 100 may be equipped in, for example, an SSD. The SSD may include a plurality of independent interfaces which are referred to as channels. A plurality of flash memory devices may be connected to one channel, and the number of flash memory devices connected to one channel may be defined as a way or a bank. The multi-chip package 100 may operate as one channel of the SSD, and each of the plurality of memory chips (for example, first to eighth memory chips) 141 to 148 may be configured with banks.

Each of the memory chips 141 to 148 may be connected to adjacent memory chips through corresponding bonding wires of a plurality of bonding wires B1 to B7. For example, the first memory chip 141 may be connected to the second memory chip 142 through the bonding wire B1. The second memory chip 142 may be connected to the third memory chip 143 through the bonding wire B2. The third memory chip 143 may be connected to the fourth memory chip 144 through the bonding wire B3. The fourth memory chip 144 may be connected to the fifth memory chip 145 through the bonding wire B4. The fifth memory chip 145 may be connected to the sixth memory chip 146 through the bonding wire B5. The sixth memory chip 146 may be connected to the seventh memory chip 147 through the bonding wire B6. The seventh memory chip 147 may be connected to the eighth memory chip 148 through the bonding wire B7. In the present embodiment, it is described that eight memory chips are included in the multi-chip package 100. However, this is merely an embodiment, and the number of memory chips is not limited thereto.

The first to eighth memory chips 141 to 148 may each include a plurality of input/output (I/O) pads. The I/O pads may include data I/O pads (hereinafter referred to as DQ pads), an impedance control pad (hereinafter referred to as a ZQ pad), command pads, and address pads. In FIG. 1, for conciseness of the conceptual description and drawings of the present embodiment, the first to eighth memory chips 141 to 148 may include one DQ pad and may respectively include DQ pads 1412, 1422, 1432, 1442, 1452, 1462, 1472, and 1482, and the DQ pads 1412, 1422, 1432, 1442, 1452, 1462, 1472, and 1482 may be disposed adjacent to one corner of a corresponding memory chip of the first to eighth memory chips 141 to 148 and may be connected to one another by the bonding wires B1 and B2. The first to eighth memory chips 141 to 148 may be stacked as a stair type so that the DQ pads 1412, 1422, 1432, 1442, 1452, 1462, 1472, and 1482 are exposed for bonding wiring.

In regard to the I/O pads, the term "pad" may comprehensively denote an electrical interconnection of an integrated circuit, and for example, may include another electrical contact point of a pin or an integrated circuit.

The first memory chip 141 may be disposed at a lowermost step among the stacked memory chips 141 to 148, connected to the conductive layers and the TSVs 122 of the PCB 120, and coupled to the external terminals 110 of the multi-chip package 100. Therefore, the first memory chip 141 may be referred to as a master chip, and the second to eighth memory chips 142 to 148 other than the first memory chip 141 may be referred to as slave chips.

The first memory chip 141 may include a ZQ pad 1411, and the ZQ pad 1411 may be connected to a corresponding conductive electrode and TSV 122 of the PCB 120 through a bonding wire A1 and may be connected to a corresponding external terminal 110 of the multi-chip package 100. The external terminal 110 connected to the ZQ pad 1411 may be referred to as a ZQ terminal 110. A resistor RZQ may be connected between the ZQ terminal 110 and a ground voltage VSS. A resistance value of the resistor RZQ may be, for example, about 240Ω.

Figure 2:
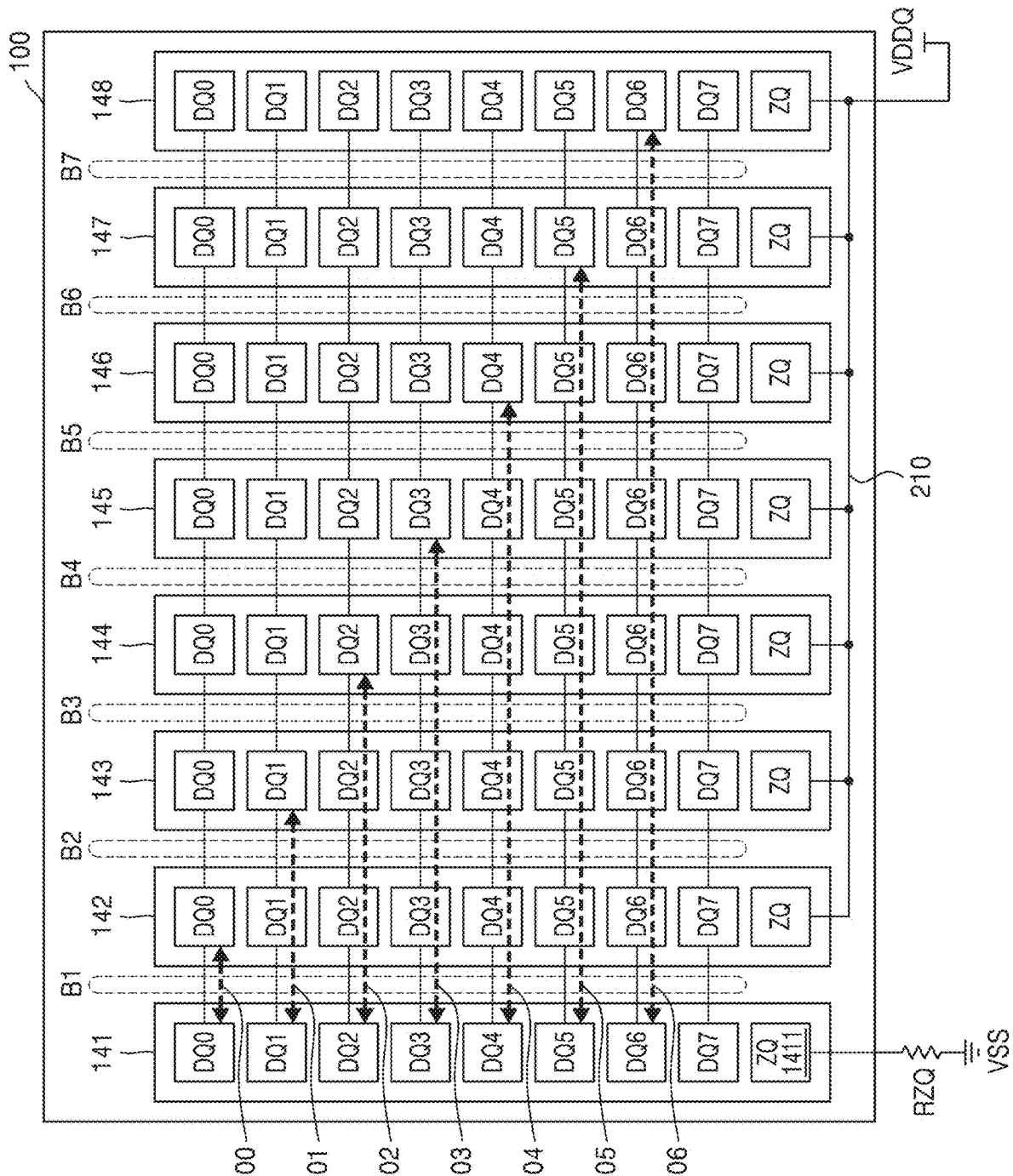
FIG. 2 is a diagram for describing a ZQ calibration method of the multi-chip package of FIG. 1 according to at least one example embodiment of the inventive concepts.

Each of the second to eighth memory chips 142 to 148 may include a ZQ pad. The ZQ pads of the second to eighth memory chips 142 to 148, as illustrated in FIG. 2, may be connected to a source voltage VDDQ via a source voltage line. The source voltage VDDQ may be a source voltage for driving a ZQ engine 310 and a plurality of I/O drivers 320 and 330 (see FIG. 3). I/O drivers 320 and 330 may each be embodied by a circuit or circuitry. I/O drivers 320 and 330 may also be referred to in the present disclosure as DQ drivers 320 and 330.

FIG. 2 is a diagram for describing a ZQ calibration method of the multi-chip package 100 of FIG. 1 according to at least one example embodiment of the inventive concepts.

Referring to FIG. 2, the first to eighth memory chips 141 to 148 of the multi-chip package 100 may include a plurality of DQ pads DQ0 to DQ7 and a ZQ pad. The DQ pads DQ0 to DQ7 of the first to eighth memory chips 141 to 148 may be connected to one another through the bonding wires B1 to B7. For example, the DQ pads DQ0 of the first to eighth memory chips 141 to 148 may be connected to one another, the DQ pads DQ1 may be connected to one another, the DQ pads DQ2 may be connected to one another, the DQ pads DQ3 may be connected to one another, the DQ pads DQ4 may be connected to one another, the DQ pads DQ5 may be connected to one another, the DQ pads DQ6 may be connected to one another, and the DQ pads DQ7 may be connected to one another. The ZQ pad 1411 of the first memory chip 141 may be connected one end of the resistor RZQ, and the other end of the resistor RZQ may be connected to the ground voltage VSS, for example, via a ground voltage line. The ZQ pads of the second to eighth memory chips 142 to 148 may be connected to a signal line (or source voltage line) 210 connected to the source voltage VDDQ.

The first memory chip 141 may control a termination resistance value of each of the DQ pads DQ0 to DQ7 of the first memory chip 141 on the basis of a result of a ZQ calibration operation performed by the ZQ engine 310 connected to the ZQ pad 1411, which is to be described with reference to FIG. 4. The ZQ engine 310 of the first memory chip 141 may perform the ZQ calibration operation by using the resistor RZQ connected to the ZQ pad 1411 to generate pull-up/pull-down calibration codes and may provide the generated pull-up/pull-down calibration codes to the I/O drivers 320 and 330 connected to the DQ pads DQ0 to DQ7 of the first memory chip 141, thereby controlling the termination resistance value of each of the DQ pads DQ0 to DQ7 of the first memory chip 141. Therefore, the DQ pads DQ0 to DQ7 of the first memory chip 141 which is the master chip may be set to have certain termination resistance values.

Each of the second to eighth memory chips 142 to 148 may perform the ZQ calibration operation on the basis of a ZQ calibration option representing a one-to-one correspondence relationship between DQ pads DQ0 to DQ6 of a corresponding memory chip and the DQ pads DQ0 to DQ6 of the first memory chip 141 which is the master chip. Each of the second to eighth memory chips 142 to 148 may perform the ZQ calibration operation coupled to a DQ pad of a corresponding memory chip by using a termination resistance value set to a corresponding DQ pad of the first memory chip 141, thereby controlling termination resistance values of DQ pads DQ0 to DQ6 of a corresponding memory.

In the present embodiment, the multi-chip package may include the eight memory chips 141 to 148 which are stacked, and each of the memory chips 141 to 148 may include eight DQ pads. The number of DQ pads for performing the ZQ calibration operation at a time between the first memory chip 141 which is the master chip and the second to eighth memory chips 142 to 148 which are the slave chips may be determined to be seven. According to at least one example embodiment of the inventive concepts, the multi-chip package 100 may include odd-numbered memory chips which are stacked, and each of the odd-numbered memory chips may include odd-numbered DQ pads.

A ZQ calibration operation 200 may be performed between the DQ pad DQ0 of the first memory chip 141 and the DQ pad DQ0 of the second memory chip 142, and thus, termination resistance values of the DQ pads DQ0 to DQ6 of the second memory 142 may be controlled. For example, the ZQ calibration operation 200 of the DQ pad DQ0 of the second memory chip 142 may be performed by using a termination resistance value set to the DQ pad DQ0 of the first memory chip 141, which is to be described with reference to FIG. 5. The second memory chip 142 may generate pull-up/pull-down calibration codes as a result of the ZQ calibration operation 200 and may provide the generated pull-up/pull-down calibration codes to the I/O drivers 320 and 330 connected to the DQ pads DQ0 to DQ6 of the second memory chip 142, thereby controlling termination resistance values (e.g., pull-up and/or pull-down termination resistance values) of the DQ pads DQ0 to DQ6 of the second memory chip 142.

A ZQ calibration operation 201 may be performed between the DQ pad DQ1 of the first memory chip 141 and the DQ pad DQ1 of the third memory chip 143, and thus, termination resistance values of the DQ pads DQ0 to DQ6 of the third memory 143 may be controlled. A ZQ calibration operation 202 may be performed between the DQ pad DQ2 of the first memory chip 141 and the DQ pad DQ2 of the fourth memory chip 144, and thus, termination resistance values of the DQ pads DQ0 to DQ6 of the fourth memory 144 may be controlled. A ZQ calibration operation 203 may be performed between the DQ pad DQ3 of the first memory chip 141 and the DQ pad DQ3 of the fifth memory chip 145, and thus, termination resistance values of the DQ pads DQ0 to DQ6 of the fifth memory 145 may be controlled. A ZQ calibration operation 204 may be performed between the DQ pad DQ4 of the first memory chip 141 and the DQ pad DQ4 of the sixth memory chip 146, and thus, termination resistance values of the DQ pads DQ0 to DQ6 of the sixth memory 146 may be controlled. A ZQ calibration operation 205 may be performed between the DQ pad DQ5 of the first memory chip 141 and the DQ pad DQ5 of the seventh memory chip 147, and thus, termination resistance values of the DQ pads DQ0 to DQ6 of the seventh memory 147 may be controlled.

A ZQ calibration operation 206 may be performed between the DQ pad DQ6 of the first memory chip 141 and the DQ pad DQ6 of the eighth memory chip 148, and thus, termination resistance values of the DQ pads DQ0 to DQ6 of the eighth memory 148 may be controlled. For example, the ZQ calibration operation 206 of the DQ pad DQ6 of the eighth memory chip 148 may be performed by using a termination resistance value set to the DQ pad DQ6 of the first memory chip 141, which is to be described with reference to FIG. 6. The eighth memory chip 148 may generate pull-up/pull-down calibration codes as a result of the ZQ calibration operation 206 and may provide the generated pull-up/pull-down calibration codes to the I/O drivers 320 and 330 connected to the DQ pads DQ0 to DQ6 of the eighth memory chip 148, thereby controlling termination resistance values (e.g., pull-up and/or pull-down termination resistance values) of the DQ pads DQ0 to DQ6 of the eighth memory chip 148.

In the present embodiment, it is described that the number of stacked memory chips 141 to 148 of the multi-chip package 100 is eight and the number of DQ pads DQ0 to DQ6 of the memory chips 141 to 148 is seven. When the number of stacked memory chips of the multi-chip package 100 is set to 2n (where n is an integer of 1 or more) or more, a ZQ calibration operation may be performed on m (where m is an integer equal to or less than 2n−1 (m≤2n−1) number of DQ pads of the memory chips.

According to at least one example embodiment of the inventive concepts, when n (where n is an integer of 1 or more) number of memory chips including m (where m is an integer of 1 or more) number of DQ pads are stacked in a multi-chip package, the number of stacked memory chips for performing a ZQ calibration operation using DQ pads at a time between a master chip and slave chips may be determined to be n≤m+1.

According to at least one example embodiment of the inventive concepts, when n (n>m+1) number of memory chips including m (where m is an integer of 1 or more) number of DQ pads are stacked in a multi-chip package, a ZQ calibration operation may be performed in the multi-chip package "i" (i=[(n−1)/m]+1) times.

Figure 3:
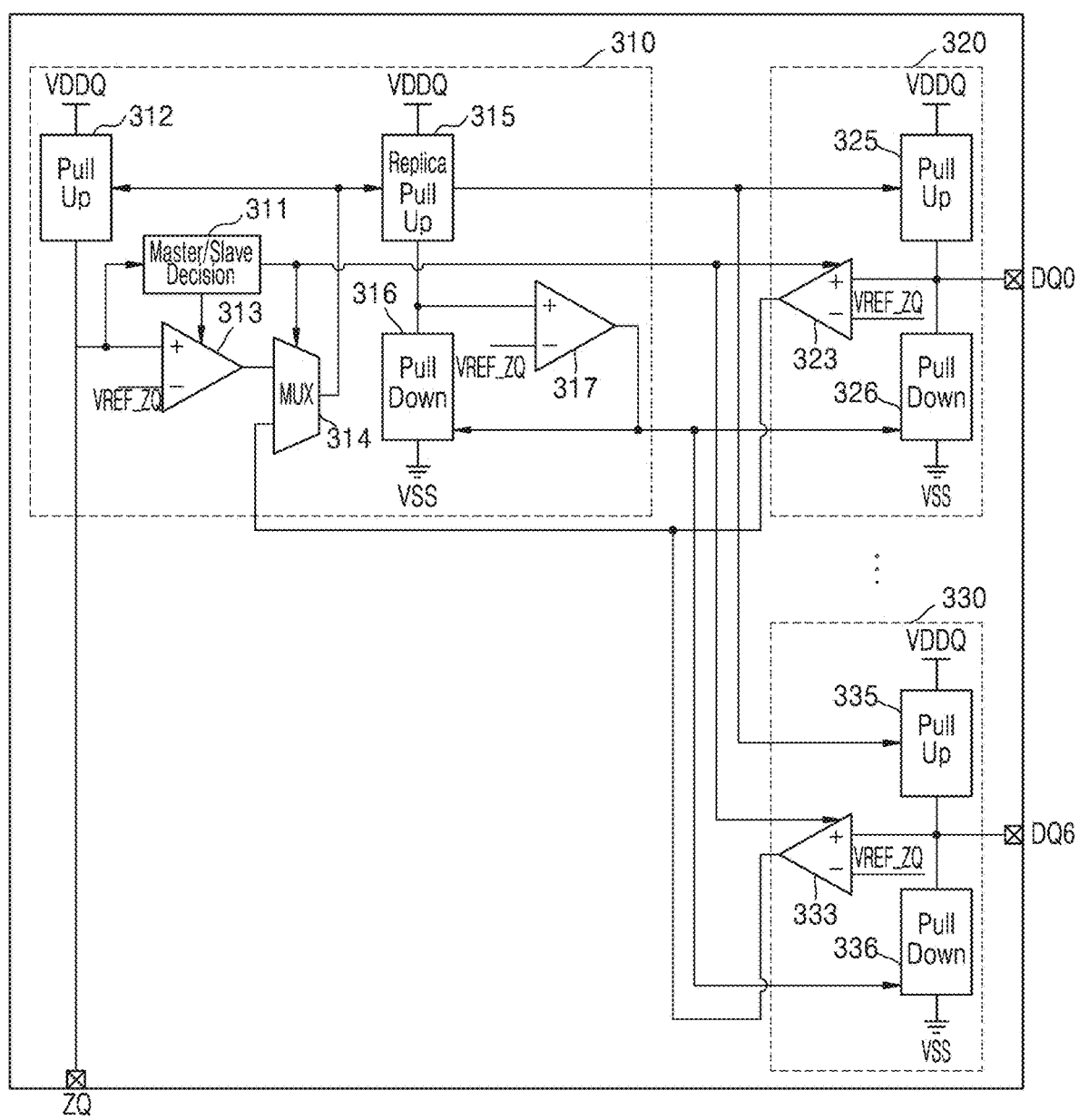
FIG. 3 is a block diagram for describing memory chips of FIG. 2 according to at least one example embodiment of the inventive concepts.

FIG. 3 is a block diagram for describing the memory chips 141 to 148 of FIG. 2 according to at least one example embodiment of the inventive concepts.

Referring to FIG. 3, each of the memory chips 141 to 148 may include a ZQ engine 310 connected to a ZQ pad and a plurality of I/O drivers 320 and 330 connected to DQ pads DQ0 to DQ6. For conciseness of the drawing, the I/O driver 320 connected to the DQ pad DQ0 of the DQ pads DQ0 to DQ6 and the I/O driver 330 connected to the DQ pad DQ6 are illustrated. The same I/O drivers as the I/O drivers 320 and 330 may be connected to the DQ pads DQ1 to DQ5. Each of the I/O drivers 320 and 330 may include a plurality of comparators 323 and 333, a plurality of pull-up units 325 and 335, and a plurality of pull-down units 326 and 336.

The ZQ engine 310 may perform a ZQ calibration operation of a corresponding memory chip. The ZQ calibration operation may include a pull-up calibration operation and a pull-down calibration operation. The ZQ engine 310 may include a master/slave determiner 311, a first pull-up unit 312, a first comparator 313, a multiplexer 314, a second pull-up unit 315, a pull-down unit 316, and a second comparator 317.

The master/slave determiner 311 may be connected to a ZQ pad. The master/slave determiner 311 may be a circuit or circuitry configured to detect a voltage level of a ZQ pad of a corresponding memory chip and to determine whether the corresponding memory chip is a master chip or a slave chip based on the detected voltage level. The master/slave determiner 311 may also be referred to in the present disclosure as master/slave circuit 311 or master/slave circuitry 311. When a voltage level of the ZQ pad is a VDDQ voltage level (e.g., a source voltage level), the master/slave determiner 311 may determine the corresponding memory chip as the slave chip. When the voltage level of the ZQ pad is not the VDDQ voltage level (e.g., the source voltage level), the master/slave determiner 311 may determine the corresponding memory chip as the master chip. The master/slave determiner 311 may store a ZQ calibration option representing each of one-to-one correspondence relationships 200 to 206 performing a ZQ calibration operation between DQ pads DQ0 to DQ6 of the master chip and the DQ pads DQ0 to DQ6 of the slave chips.

When it is determined by the master/slave determiner 311 that the corresponding memory chip is the master chip, the first comparator 313 may be or include a circuit or circuitry configured to compare a voltage of the ZQ pad with a reference voltage VREF_ZQ. The reference voltage VREF_ZQ may have a voltage level corresponding to half (VDDQ/2) of the VDDQ voltage level (e.g., the source voltage level).

An output of the first comparator 313 may be provided as a first input of the multiplexer 314. An output of each of the comparators 323 and 333 of the I/O drivers 320 and 330 may be provided as a second input of the multiplexer 314. The comparators 323 and 333 may each be embodied by a circuit or circuitry. When it is determined by the master/slave determiner 311 that the corresponding memory chip is the master chip, the multiplexer 314 may output the output of the first comparator 313 input as the first input thereof, and when it is determined by the master/slave determiner 311 that the corresponding memory chip is the slave chip, the multiplexer 314 may output the output of each of the comparators 323 and 333 of the I/O drivers 320 and 330 input as the second input thereof.

The first pull-up unit 312 may be or include a circuit or circuitry configured to perform a pull-up calibration operation on the basis of the output of the first comparator 313. The first pull-up unit 312 may generate a pull-up calibration code on the basis of the output of the first comparator 313, and in this case, the pull-up calibration operation may be performed by varying the pull-up calibration code until a voltage of the ZQ pad is equal to the reference voltage VREF_ZQ. The first pull-up unit 312 may provide the second pull-up unit 315 and the pull-up units 325 and 335 of the I/O drivers 320 and 330 with the pull-up calibration code at a time when the voltage of the ZQ pad is equal to the reference voltage VREF_ZQ. The pull-up units 325 and 335 may each be embodied by a circuit or circuitry.

The second pull-up unit 315 may be or include a circuit or circuitry that has substantially the same configuration as that of the first pull-up unit 312. An impedance of the second pull-up unit 315 may be controlled based on the pull-up calibration code. Therefore, the impedance of the second pull-up unit 315 may be substantially the same as that of the first pull-up unit 312.

The second comparator 317 may be or include a circuit or circuitry configured to compare the reference voltage VREF_ZQ with a voltage of a connection node between the second pull-up unit 315 and the pull-down unit 316.

The pull-down unit 316 may be or include a circuit or circuitry configured to perform a pull-down calibration operation on the basis of the output of the second comparator 317. The pull-down unit 316 may generate a pull-down calibration code on the basis of an output of the second comparator 317, and in this case, a pull-down calibration operation may be performed by varying the pull-down calibration code until the voltage of the connection node between the second pull-up unit 315 and the pull-down unit 316 is equal to the reference voltage VREF_ZQ. The pull-down unit 316 may provide the pull-down units 326 and 336 of the I/O drivers 320 and 330 with the pull-down calibration code at a time when the voltage of the connection node between the second pull-up unit 315 and the pull-down unit 316 is equal to the reference voltage VREF_ZQ. The pull-down units 326 and 336 may each be embodied by a circuit or circuitry.

The pull-up/pull-down calibration codes generated by the ZQ engine 310 may be provided to the I/O drivers 320 and 330 connected to the DQ pads DQ0 to DQ6, and thus, termination resistance values (e.g., pull-up and/or pull-down termination resistance values) of the DQ pads DQ0 to DQ6 may be controlled.

Figure 4:
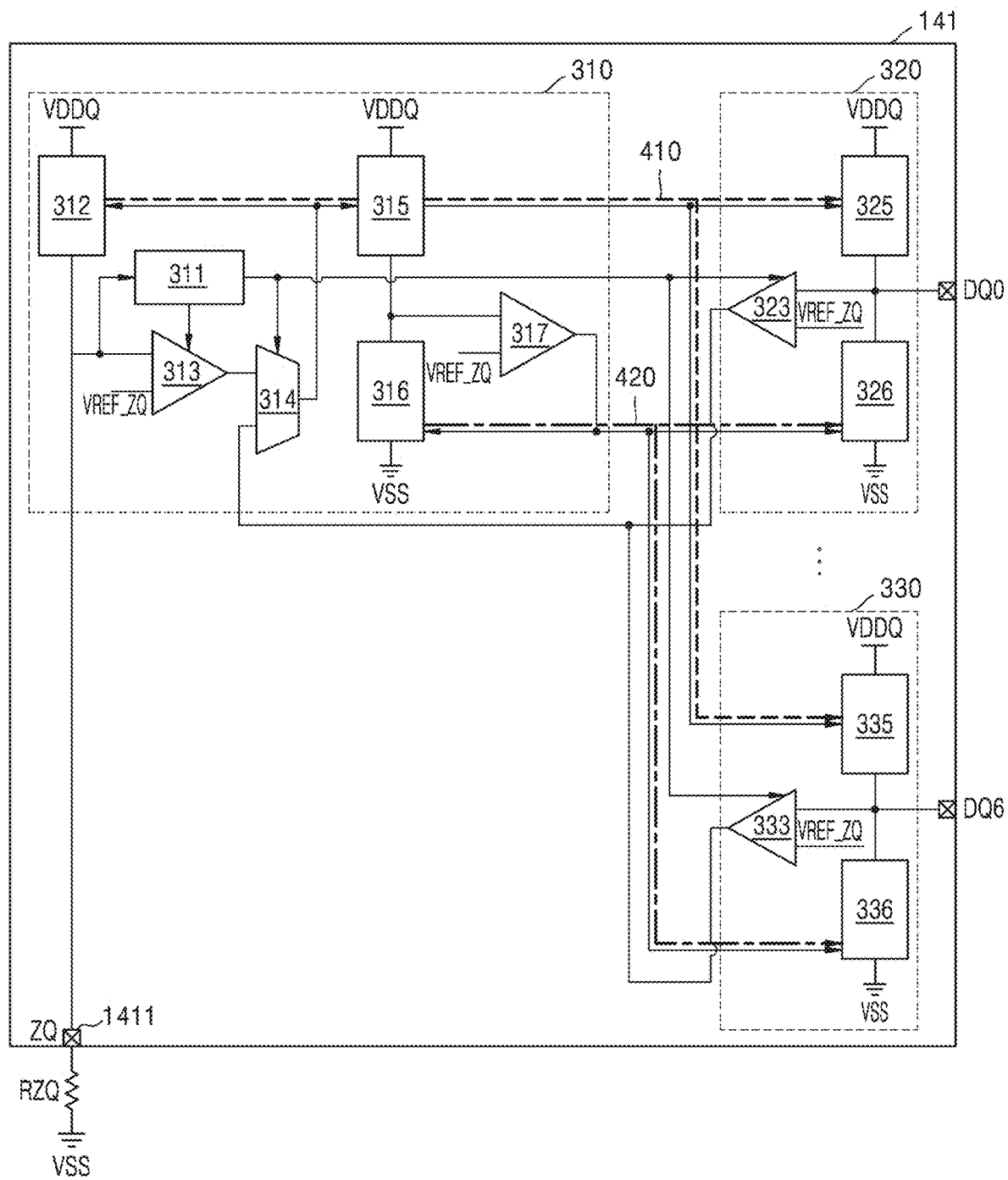
FIG. 4 is a diagram for describing a ZQ calibration operation performed by a master chip according to at least one example embodiment of the inventive concepts.

FIG. 4 is a diagram for describing a ZQ calibration operation performed by a master chip according to at least one example embodiment of the inventive concepts.

Referring to FIGS. 2 and 4, a ZQ calibration operation of a first memory chip 141 which is a master chip will be described. A ZQ pad 1411 of the first memory chip 141 may be connected to a resistor RZQ. A master/slave determiner 311 may detect that a voltage level of the ZQ pad 1411 is not a VDDQ voltage level (e.g., a source voltage level), and thus, may determine the first memory chip 141 as the master chip.

A first comparator 313 may compare a voltage of the ZQ pad 1411 with a reference voltage VREF_ZQ and may provide a comparison result to a first pull-up unit 312 through a multiplexer 314. The first pull-up unit 312 may perform a pull-up calibration operation on the basis of an output of a first comparator 313 and may provide a second pull-up unit 315 and pull-up units 325 and 335 of I/O drivers 320 and 330 with a pull-up calibration code at a time when the voltage of the ZQ pad 1411 is equal to the reference voltage VREF_ZQ (410).

An impedance of the second pull-up unit 315 may be controlled based on the pull-up calibration code. A second comparator 317 may compare a level of the reference voltage VREF_ZQ with a level of a voltage of a connection node between the second pull-up unit 315 and a pull-down unit 316. The pull-down unit 316 may perform a pull-down calibration operation on the basis of an output of a second comparator 317 and may provide pull-down units 326 and 336 of the I/O drivers 320 and 330 with a pull-down calibration code at a time when the voltage of the connection node between the second pull-up unit 315 and the pull-down unit 316 is equal to the reference voltage VREF_ZQ (420).

A ZQ engine 310 may perform a ZQ calibration operation by using the resistor RZQ connected to the ZQ pad 1411. The ZQ engine 310 may be configured so that pull-up calibration codes generated as a result of the ZQ calibration operation are simultaneously provided to the pull-up units 325 and 335 of the I/O drivers 320 and 330 connected to the DQ pads DQ0 to DQ6 (420), and moreover, may be configured so that pull-down calibration codes are simultaneously provided to the pull-down units 326 and 336 of the I/O drivers 320 and 330 connected to the DQ pads DQ0 to DQ6 (420). Therefore, the DQ pads DQ0 to DQ6 of the first memory chip 141 which is the master chip may be set to have certain termination resistance values.

Figure 5:
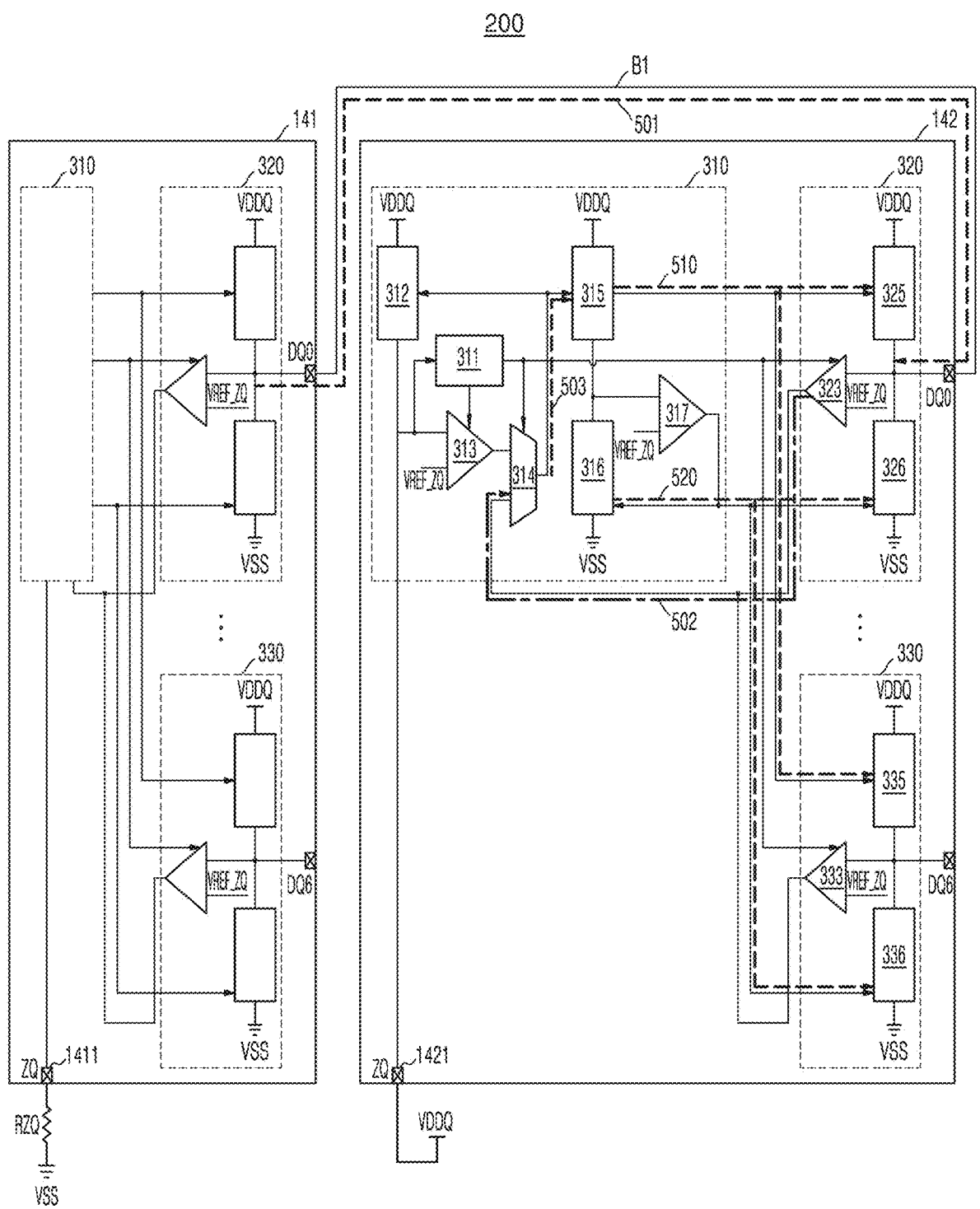
FIG. 5 is a diagram for describing a ZQ calibration operation performed by a slave chip according to at least one example embodiment of the inventive concepts.

FIG. 5 is a diagram for describing a ZQ calibration operation performed by a slave chip according to at least one example embodiment of the inventive concepts.

Referring to FIGS. 2 and 5, a ZQ calibration operation 200 performed between a DQ pad DQ0 of a first memory chip 141 which is a master chip and a DQ pad DQ0 of a second memory chip 142 which is a slave chip will be described, and for example, the ZQ calibration operation 200 performed by the second memory chip 142 will be described.

The DQ pad DQ0 of the first memory chip 141 may be connected to the DQ pad DQ0 of the second memory chip 142 through a bonding wire B1. Also, a ZQ pad 1421 of the second memory chip 142 may be connected to a VDDQ voltage line. A master/slave determiner 311 may detect that a voltage level of the ZQ pad 1421 is a VDDQ voltage level (e.g., a source voltage level), and thus, may determine the second memory chip 142 as the slave chip.

When it is determined by the master/slave determiner 311 that the second memory chip 142 is the slave chip, an output of a comparator 323 of an I/O driver 320 connected to a DQ pad DQ0 of the second memory chip 142 may be provided to a multiplexer 314 (502). The comparator 323 may compare a level of a reference voltage VREF_ZQ with a voltage level of the DQ pad DQ0 of the second memory chip 142. An output of the comparator 323 may be provided to a second pull-up unit 315 through the multiplexer 314 (503). A pull-up calibration operation may be performed in the first pull-up unit 312 and the second pull-up unit 315 on the basis of the output of the comparator 323, and a pull-up calibration code generated as a result of the pull-up calibration operation may be provided to pull-up units 325 and 335 of I/O drivers 320 and 330 (510).

An impedance of the second pull-up unit 315 may be controlled based on the pull-up calibration code, and a second comparator 317 may compare a level of the reference voltage VREF_ZQ with a voltage level of a connection node between the second pull-up unit 315 and a pull-down unit 316. The pull-down unit 316 may perform a pull-down calibration operation on the basis of an output of a second comparator 317 and may provide pull-down units 326 and 336 of the I/O drivers 320 and 330 with a pull-down calibration code at a time when a voltage of the connection node between the second pull-up unit 315 and the pull-down unit 316 is equal to the reference voltage VREF_ZQ (520).

A ZQ engine 310 may perform a ZQ calibration operation coupled to the DQ pad DQ0 of the second memory chip 142 by using a termination resistance value set to the DQ pad DQ0 of the first memory chip 141. The ZQ engine 310 may be configured so that pull-up calibration codes generated as a result of the ZQ calibration operation are simultaneously provided to the pull-up units 325 and 335 of the I/O drivers 320 and 330 connected to DQ pads DQ0 to DQ6 (510), and moreover, may be configured so that pull-down calibration codes are simultaneously provided to the pull-down units 326 and 336 of the I/O drivers 320 and 330 connected to DQ pads DQ0 to DQ6 (520). Therefore, the DQ pads DQ0 to DQ6 of the second memory chip 142 which is the slave chip may be set to have certain termination resistance values.

Figure 6:
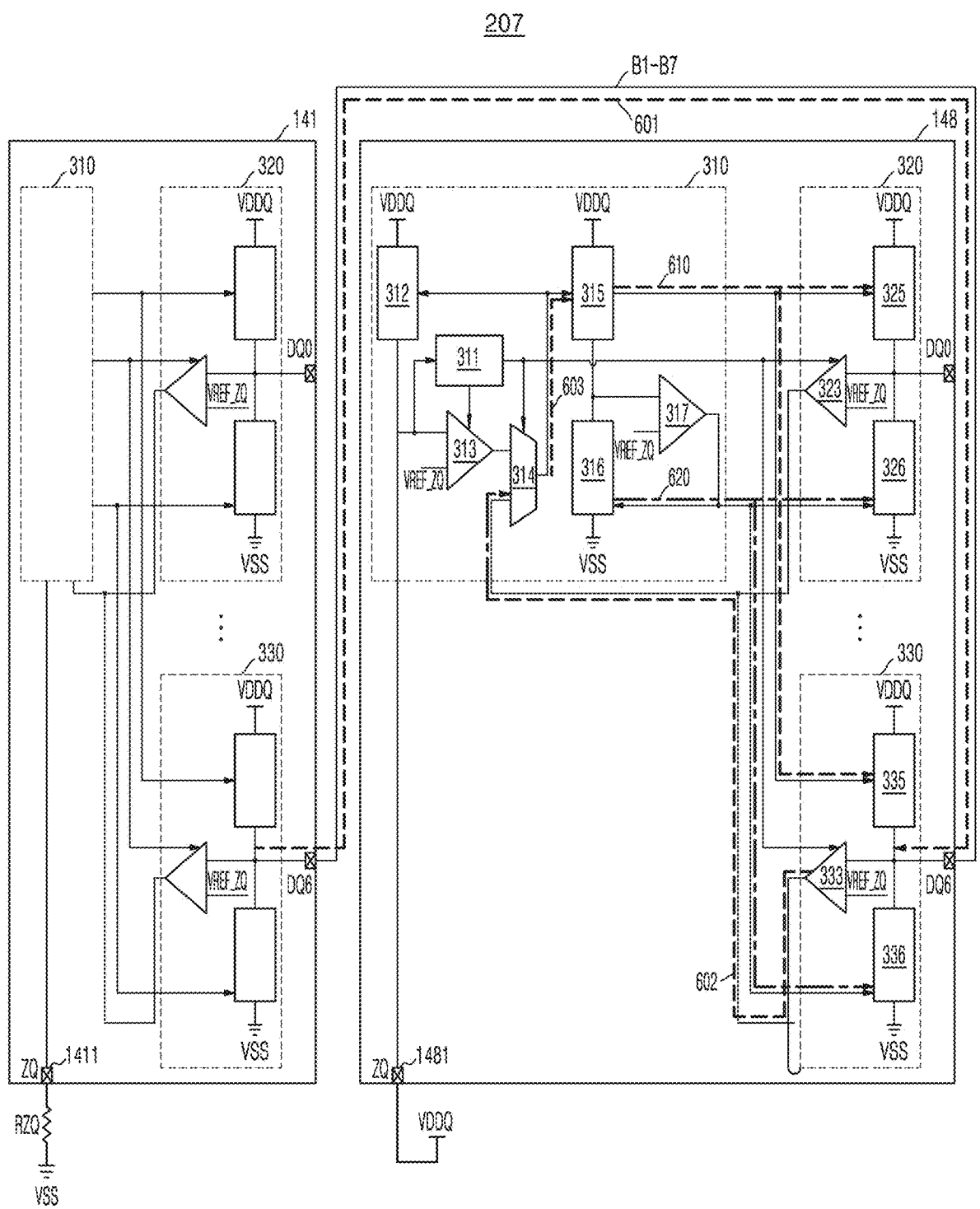
FIG. 6 is a diagram for describing a ZQ calibration operation performed by a slave chip according to at least one example embodiment of the inventive concepts.

FIG. 6 is a diagram for describing a ZQ calibration operation performed by a slave chip according to at least one example embodiment of the inventive concepts.

Referring to FIGS. 2 and 6, a ZQ calibration operation 207 performed between a DQ pad DQ6 of a first memory chip 141 which is a master chip and a DQ pad DQ6 of an eighth memory chip 148 which is a slave chip will be described, and for example, the ZQ calibration operation 207 performed by the eighth memory chip 148 will be described.

The DQ pad DQ6 of the first memory chip 141 may be connected to the DQ pad DQ6 of the eighth memory chip 148 through bonding wires B1 to B7. Also, a ZQ pad 1481 of the eighth memory chip 148 may be connected to a VDDQ voltage line. A master/slave determiner 311 may detect that a voltage level of a ZQ pad 1481 is a VDDQ voltage level (e.g., a source voltage level), and thus, may determine the eighth memory chip 148 as the slave chip.

When it is determined by a master/slave determiner 311 that the eighth memory chip 148 is the slave chip, an output of a comparator 323 of an I/O driver 320 connected to a DQ pad DQ8 of the eighth memory chip 148 may be provided to a multiplexer 314 (602). The comparator 323 may compare a level of a reference voltage VREF_ZQ with a voltage level of the DQ pad DQ6 of the eighth memory chip 148. An output of the comparator 323 may be provided to a second pull-up unit 315 through the multiplexer 314 (603). A pull-up calibration operation may be performed in the first pull-up unit 312 and the second pull-up unit 315 on the basis of the output of the comparator 323, and a pull-up calibration code generated as a result of the pull-up calibration operation may be provided to pull-up units 325 and 335 of I/O drivers 320 and 330 (610).

An impedance of the second pull-up unit 315 may be controlled based on the pull-up calibration code, and a second comparator 317 may compare a level of the reference voltage VREF_ZQ with a voltage level of a connection node between the second pull-up unit 315 and a pull-down unit 316. The pull-down unit 316 may perform a pull-down calibration operation on the basis of an output of the second comparator 317 and may provide pull-down units 326 and 336 of the I/O drivers 320 and 330 with a pull-down calibration code at a time when a voltage of the connection node between the second pull-up unit 315 and the pull-down unit 316 is equal to the reference voltage VREF_ZQ (620).

A ZQ engine 310 may perform a ZQ calibration operation coupled to the DQ pad DQ6 of the eighth memory chip 148 by using a termination resistance value set to the DQ pad DQ6 of the first memory chip 141. The ZQ engine 310 may be configured so that pull-up calibration codes generated as a result of the ZQ calibration operation are simultaneously provided to the pull-up units 325 and 335 of the I/O drivers 320 and 330 connected to DQ pads DQ0 to DQ6 (610), and moreover, may be configured so that pull-down calibration codes are simultaneously provided to the pull-down units 326 and 336 of the I/O drivers 320 and 330 connected to DQ pads DQ0 to DQ6 (620). Therefore, the DQ pads DQ0 to DQ6 of the eighth memory chip 148 which is the slave chip may be set to have certain termination resistance values.

Figure 7:
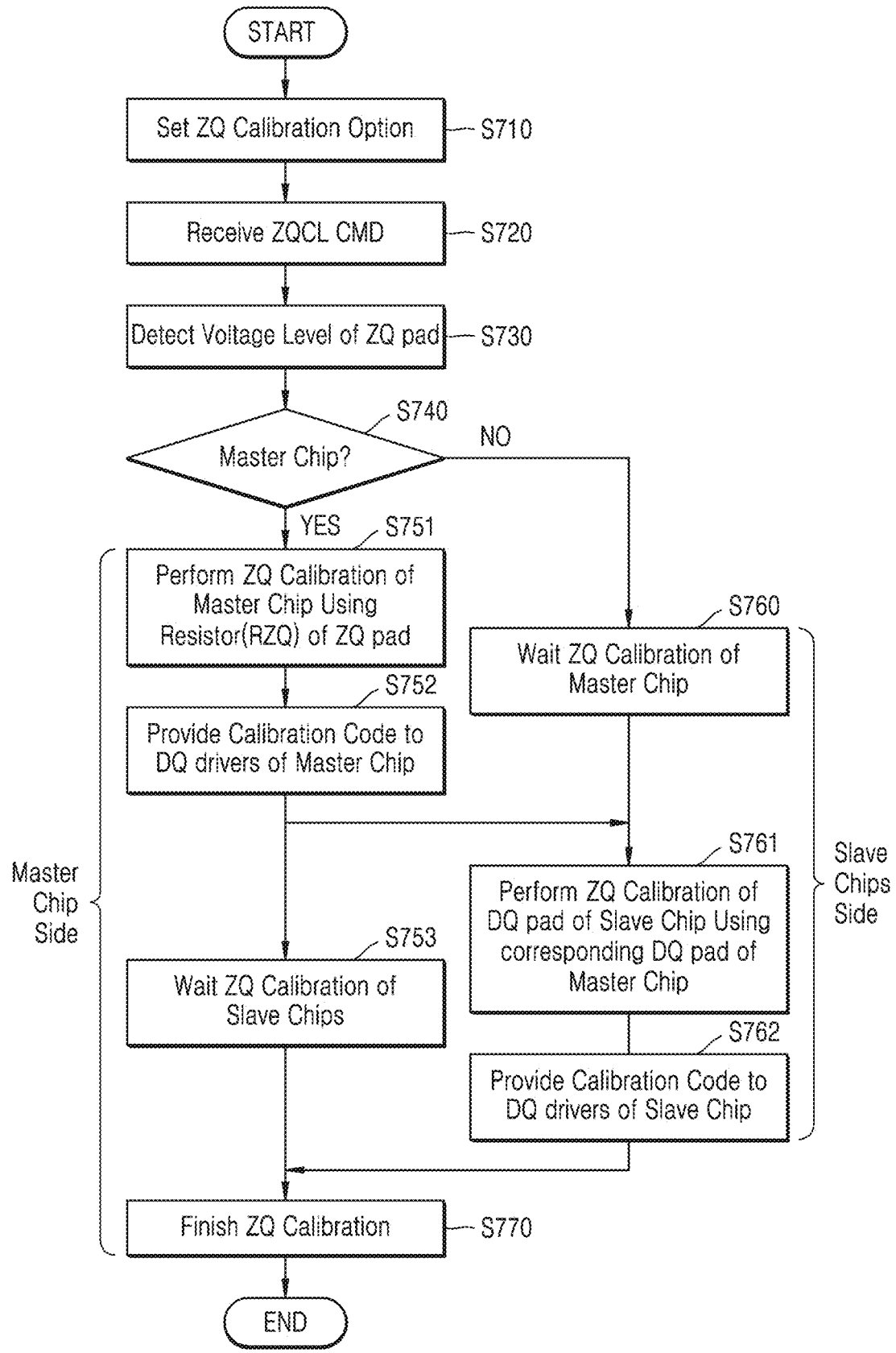
FIG. 7 is a diagram for describing a ZQ calibration method of a multi-chip package according to at least one example embodiment of the inventive concepts.

FIG. 7 is a diagram for describing a ZQ calibration method of a multi-chip package according to at least one example embodiment of the inventive concepts.

Referring to FIGS. 1, 2, 3, and 7, a ZQ calibration option of a multi-chip package 100 may be set in operation S710. The ZQ calibration option may include the one-to-one correspondence relationships 200 to 206 performing the ZQ calibration operation between the DQ pads DQ0 to DQ6 of the master chip and the DQ pads DQ0 to DQ6 of the slave chips. The ZQ calibration option may be set in a register of the first memory chip 141 which operates as the master chip. Alternatively, the ZQ calibration option may be set in a register of each of the first to eighth memory chips 141 to 148. Alternatively, the ZQ calibration option may be set in the master/slave determiner 311 of each of the first to eighth memory chips 141 to 148.

For example, the ZQ calibration option may be configured so that the ZQ calibration operation 200 is performed between the DQ pad DQ0 of the first memory chip 141 and the DQ pad DQ0 of the second memory chip 142. Also, the ZQ calibration option may be configured so that the ZQ calibration operation 201 is performed between the DQ pad DQ1 of the first memory chip 141 and the DQ pad DQ1 of the third memory chip 143, the ZQ calibration operation 202 is performed between the DQ pad DQ2 of the first memory chip 141 and the DQ pad DQ2 of the fourth memory chip 144, the ZQ calibration operation 203 is performed between the DQ pad DQ3 of the first memory chip 141 and the DQ pad DQ3 of the fifth memory chip 145, the ZQ calibration operation 204 is performed between the DQ pad DQ4 of the first memory chip 141 and the DQ pad DQ4 of the sixth memory chip 146, the ZQ calibration operation 205 is performed between the DQ pad DQ5 of the first memory chip 141 and the DQ pad DQ5 of the seventh memory chip 147, and the ZQ calibration operation 206 is performed between the DQ pad DQ6 of the first memory chip 141 and the DQ pad DQ6 of the eighth memory chip 148.

A ZQ calibration command ZQCL may be received through the terminals 110 of the multi-chip package 100 in operation 720. The ZQ calibration command ZQCL may be provided by a memory controller of an electronic device including the multi-chip package 100. The electronic device may include, for example, a computing system, a server, a server array or a server farm, a web server, a network server, an Internet server, a workstation, a mini computer, a main frame computer, a web tool, or a combination thereof.

The multi-chip package 100 may detect a voltage level of each of ZQ pads by using the master/slave determiner 311 of each of the first to eighth memory chips 141 to 148 in response to the ZQ calibration command ZQCL in operation S730.

When a voltage level of a ZQ pad of a corresponding memory chip is the VDDQ voltage level (e.g., the source voltage level), the master/slave determiner 311 of each of the first to eighth memory chips 141 to 148 may determine the corresponding memory chip as the slave chip in operation S740, and operation S760 may be performed.

When the voltage level of the ZQ pad of the corresponding memory chip is not the VDDQ voltage level, the master/slave determiner 311 of each of the first to eighth memory chips 141 to 148 may determine the corresponding memory chip as the master chip in operation S740, and operation S751 may be performed.

When the corresponding memory chip (for example, the first memory chip 141) is the master chip in operation S740, the ZQ engine 310 of the first memory chip 141 may perform a ZQ calibration operation by using the resistor RZQ connected to the ZQ pad 1411 in operation S751. The ZQ engine 310 of the first memory chip 141 may perform a pull-up calibration operation of generating a pull-up calibration code on the basis of a result obtained by comparing a voltage of the ZQ pad 1411 with the reference voltage VREF_ZQ and may perform a pull-down calibration operation of generating a pull-down calibration code on the basis of a result obtained by comparing the level of the reference voltage VREF_ZQ with a voltage level of a connection node between the second pull-up unit 315 and the pull-down unit 316 controlled based on the pull-up calibration code.

The ZQ engine 310 of the first memory chip 141 which is the master chip may provide pull-up/pull-down calibration codes, generated as a result of the ZQ calibration operation (S750), to the I/O drivers 320 and 330 connected to the DQ pads DQ0 to DQ6 of the first memory chip 141 in operation S752. Therefore, the DQ pads DQ0 to DQ6 of the first memory chip 141 which is the master chip may be set to have certain termination resistance values.

Subsequently, the first memory chip 141 which is the master chip may end the ZQ calibration operation and may wait for until ZQ calibration operations of the slave chips end in operation S753.

When the corresponding memory chip (for example, the second memory chip 142) is the slave chip in operation S740, the second memory chip 142 which is the slave chip may wait for until the ZQ calibration operation of the first memory chip 141 which is the master chip ends in operation S760.

When the ZQ calibration operation of the first memory chip 141 which is the master chip ends in operation S751, the ZQ engine 310 of the second memory chip 142 which is the slave chip may perform a ZQ calibration operation coupled to the DQ pad of the second memory chip 142 by using a termination resistance value set to the DQ pad of the first memory chip 141 which is the master chip in operation S761. The ZQ engine 310 of the second memory chip 142 may perform a pull-up calibration operation of generating a pull-up calibration code on the basis of a result obtained by comparing the reference voltage VREF_ZQ with a voltage of the DQ pad DQ0 of the second memory chip 142 connected to the DQ pad DQ0 of the first memory chip 141 and may perform a pull-down calibration operation of generating a pull-down calibration code on the basis of a result obtained by comparing the level of the reference voltage VREF_ZQ with a voltage level of a connection node between the second pull-up unit 315 and the pull-down unit 316 controlled based on the pull-up calibration code.

The ZQ engine 310 of the second memory chip 142 which is the slave chip may provide pull-up/pull-down calibration codes, generated as a result of the ZQ calibration operation (S750), to the I/O drivers 320 and 330 connected to the DQ pads DQ0 to DQ6 of the second memory chip 142 in operation S762. Therefore, the DQ pads DQ0 to DQ6 of the second memory chip 142 which is the slave chip may be set to have certain termination resistance values.

Operations S760, S761, and S762 described on the second memory chip 142 which is the slave chip may be identically and simultaneously applied to the third to eighth memory chips 143 to 148 which are the slave chips. That is, each of the second to eighth memory chips 142 to 148 which are the slave chips may wait for until the ZQ calibration operation of the first memory chip 141 which is the master chip ends in operation S760. Each of the second to eighth memory chips 142 to 148 may perform the ZQ calibration operation by using a termination resistance value set to each of the DQ pads DQ0 to DQ6 of the first memory chip 141 on the basis of one-to-one correspondence relationships between DQ pads DQ0 to DQ6 of the corresponding memory chip and the DQ pads DQ0 to DQ6 of the first memory chip 141 which is the master chip in operation S761. Each of the second to eighth memory chips 142 to 148 may perform a ZQ calibration operation coupled to the DQ pad of the corresponding memory chip by using a termination resistance value set to a corresponding DQ pad of the first memory chip 141 to control termination resistance values of the DQ pads DQ0 to DQ6 of the corresponding memory chip in operation S762.

Figure 8:
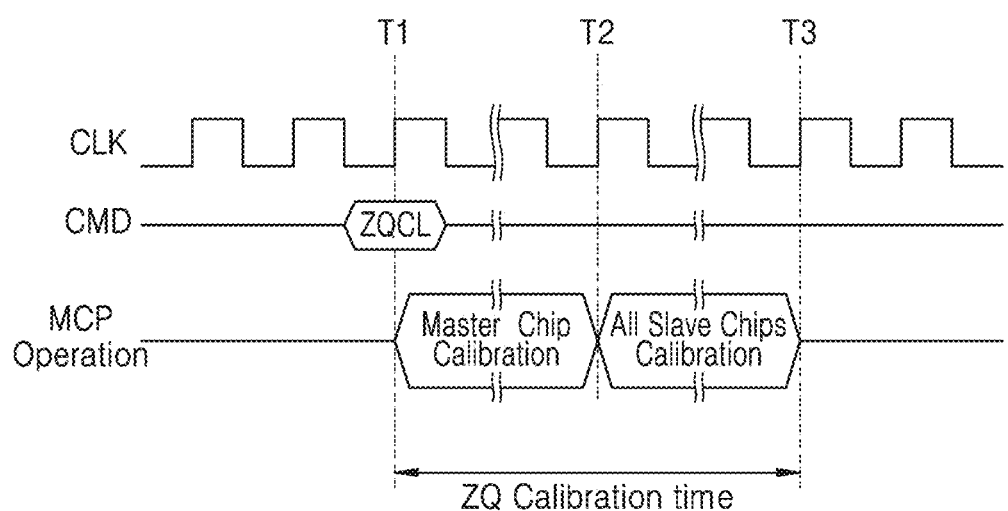
FIG. 8 is an operation timing diagram based on the ZQ calibration method of the multi-chip package of FIG. 7 according to at least one example embodiment of the inventive concepts.

FIG. 8 is an operation timing diagram based on the ZQ calibration method of the multi-chip package 100 of FIG. 7 according to at least one example embodiment of the inventive concepts. FIG. 8 shows a timing diagram of an operation of the multi-chip package 100 which is performed based on a clock signal CLK according to communication protocols or specifications. It should be construed that timing diagrams described herein are not illustrated at a certain ratio.

Referring to FIG. 8, at a time T1, a ZQ calibration command ZQCL may be received by the multi-chip package 100. In response to the ZQ calibration command ZQCL, the first memory chip 141 acting as a master chip of the multi-chip package 100 may perform a ZQ calibration operation by using the resistor RZQ connected to the ZQ pad 1411. As a result of the ZQ calibration operation of the first memory chip 141, the DQ pads DQ0 to DQ6 of the first memory chip 141 may be set to have certain termination resistance values.

At a time T2, when the ZQ calibration operation of the first memory chip 141 which is the master chip ends, each of the second to eighth memory chips 142 to 148 which are the slave chips may perform a ZQ calibration operation coupled to a DQ pad of a corresponding memory chip by using a termination resistance value set to a corresponding DQ pad of the first memory chip 141 which is the master chip. As a result of the ZQ calibration operation of each of the second to eighth memory chips 142 to 148, the DQ pads DQ0 to DQ6 of each of the second to eighth memory chips 142 to 148 may be set to have certain termination resistance values.

During an interval between the time T2 and a time T3, the ZQ calibration operations of the second to eighth memory chips 142 to 148 which are the slave memory chips may end. The interval between the time T2 and the time T3 may represent a time taken until second ZQ calibration operations of all slave memory chips end. The interval between the time T2 and the time T3 may be longer than a time taken until the second ZQ calibration operation of one slave memory chip is completed. For example, the interval between the time T2 and the time T3 may be shorter than a time which is two times a time taken until the second ZQ calibration operation of one slave memory chip is completed.

As described above, the first memory chip 141 corresponding to the master chip among the plurality of memory chips 141 to 148 may perform a one-time ZQ calibration operation, and then, the second to eighth memory chips 142 to 148 which are the other slave chips may simultaneously perform a one-time ZQ calibration operation, thereby completing the ZQ calibration operation of the multi-chip package 100. That is, the ZQ calibration operation of the multi-chip package 100 may be completed by performing the ZQ calibration operation twice, and thus, it may be seen that a ZQ calibration time is considerably reduced compared to the related art where the ZQ calibration operation is performed eight times as described below with reference to FIGS. 9A and 9B.

Figure 9A:
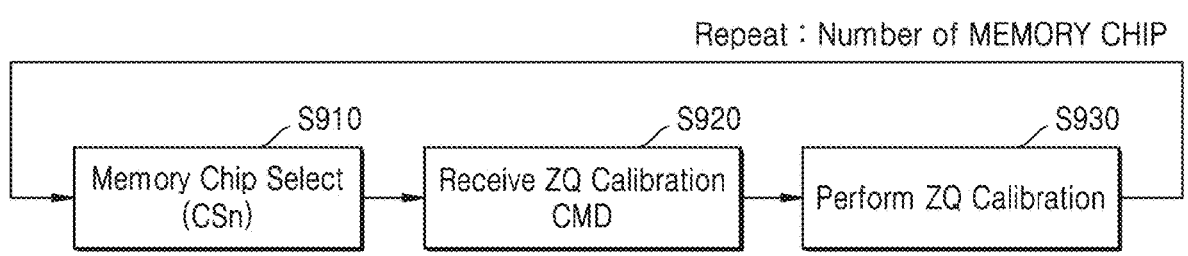
FIGS. 9A and 9B are diagrams for describing a ZQ calibration method of a multi-chip package of the related art.
Figure 9B:
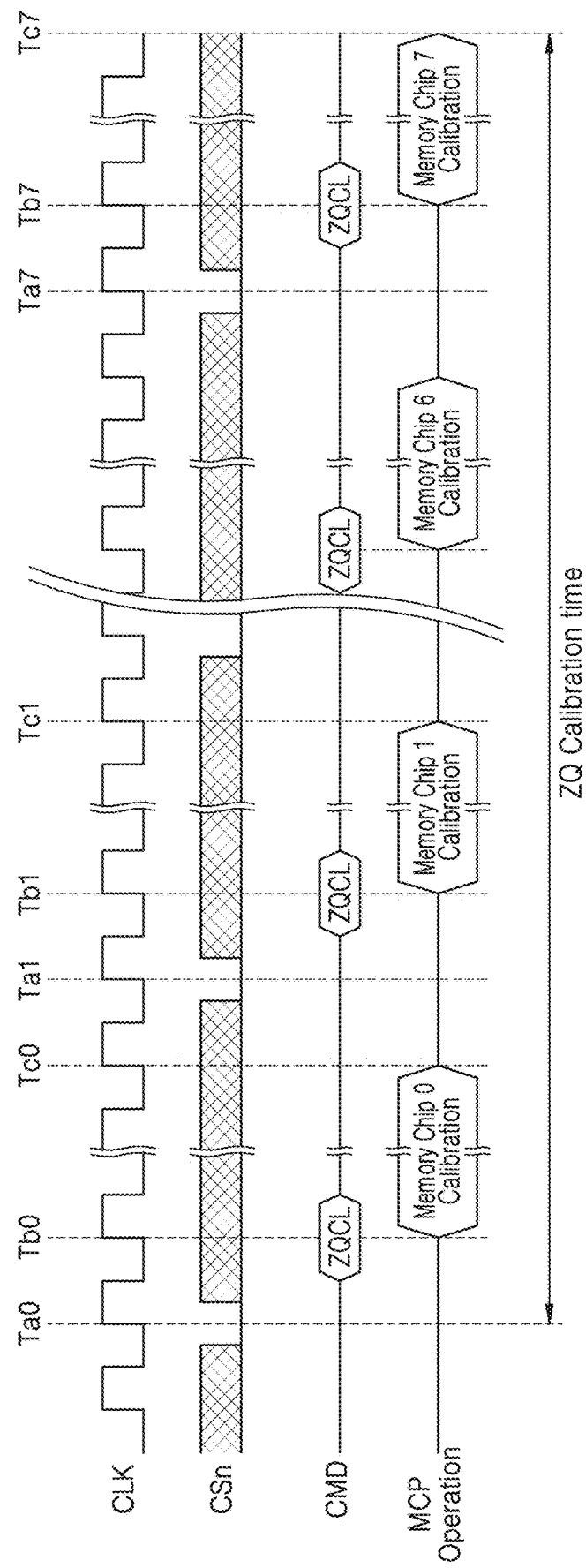

FIGS. 9A and 9B are diagrams for describing a ZQ calibration method of a multi-chip package of the related art. An example, where the ZQ calibration method of FIGS. 9A and 9B is performed by the multi-chip package 100 including the eight memory chips 141 to 148 as in FIG. 1, will be described below.

Referring to FIGS. 9A and 9B, a chip selection signal CSn for selecting one memory chip from among the memory chips 141 to 148 may be received in operation S910. For example, at a time Ta0, a chip selection signal CSn for selecting the first memory chip 141 may be applied to the first memory chip 141 in operation S910. At a time Tb0, a ZQ calibration command ZQCL corresponding to the first memory chip 141 may be received in operation S920. A ZQ calibration operation of the first memory chip 141 may be performed in response to the ZQ calibration command ZQCL in operation S930, and at a time Tc0, the ZQ calibration operation of the first memory chip 141 may end.

After the ZQ calibration operation of the first memory chip 141 ends, a chip selection signal CSn for selecting the second memory chip 142 may be applied to the second memory chip 142 at a time Ta1 in operation S910. At a time Tb1, a ZQ calibration command ZQCL corresponding to the second memory chip 141 may be received in operation S920, and a ZQ calibration operation of the second memory chip 142 may be performed in response to the ZQ calibration command ZQCL in operation S930. At a time Tc1, the ZQ calibration operation of the second memory chip 142 may end.

In this manner, ZQ calibration operations of the third to eighth memory chips 143 to 148 may be sequentially performed, and when a ZQ calibration operation of the eighth memory chip 148 ends at a time Tc7, the ZQ calibration operation of the multi-chip package 100 may end. That is, since the ZQ calibration operation is performed for each of the first to eighth memory chips 141 to 148, the ZQ calibration operation of the multi-chip package 100 may include eight ZQ calibration operations. The ZQ calibration method of the multi-chip package of the related art may have a problem where a long ZQ calibration time is taken in proportion to the number of stacked memory chips of the multi-chip package 100.

Figure 10:
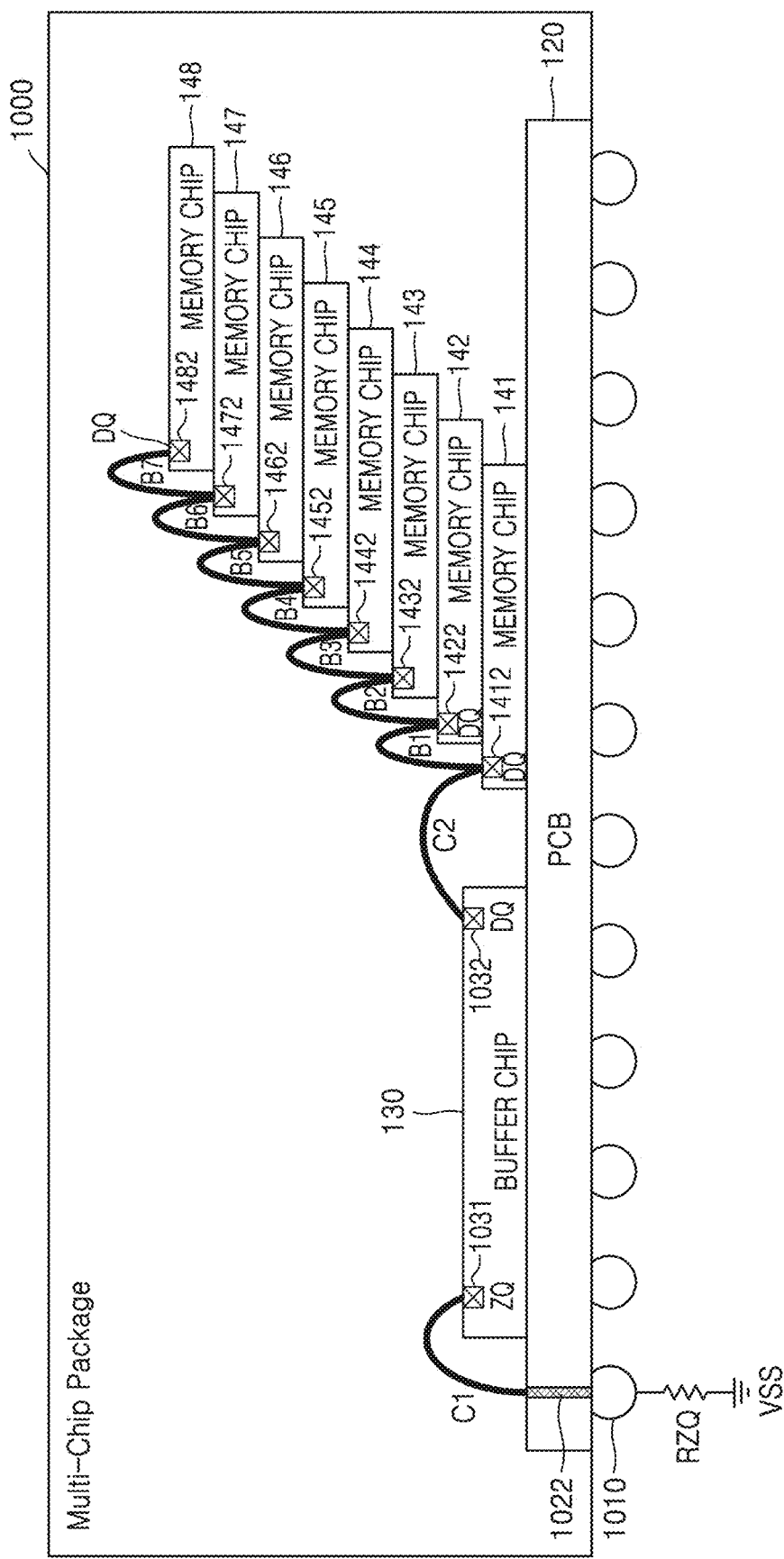
FIG. 10 is a diagram for describing a multi-chip package according to at least one example embodiment of the inventive concepts.

FIG. 10 is a diagram for describing a multi-chip package 1000 according to at least one example embodiment of the inventive concepts.

Referring to FIG. 10, the multi-chip package 1000 may include a buffer chip 130 and first to eighth memory chips 141 to 148, which are mounted on a PCB 120. The buffer chip 130 may be electrically connected to external terminals 1010 of the multi-chip package 1000 through a bonding wire C1. The buffer chip 130 may include a ZQ pad 1031 and a DQ pad 1032. The ZQ pad 1031 may be connected to a TSV 1022 and a conductive electrode of the PCB 120 through a bonding wire C1 and may be coupled to an external terminal 1010 of the multi-chip package 100. The external terminal 1010 connected to the ZQ pad 1031 may be a ZQ terminal. A resistor RZQ may be connected between the ZQ terminal 110 and a ground voltage VSS. The DQ pad 1032 may be connected to DQ pads 1412, 1422, 1432, 1442, 1452, 1462, 1472, and 1482 of the first to eighth memory chips 141 to 148 through a bonding wire C2. Hereinafter, description of the multi-chip package 1000 which is the same as or similar to the description of FIG. 1 is omitted.

The buffer chip 130 may control the first to eighth memory chips 141 to 148. The first to eighth memory chips 141 to 148 may perform a certain operation on the basis of control by the buffer chip 130. For example, the buffer chip 130 may operate as a memory controller. In controlling ZQ calibration operations of the DQ pads 1412, 1422, 1432, 1442, 1452, 1462, 1472, and 1482 of the first to eighth memory chips 141 to 148, the buffer chip 130 may operate like the first memory chip 141, which is the master chip, of FIG. 1. In this case, the first memory chip 141 may be a slave chip and may operate like the second to eighth memory chips 142 to 148.

Figure 11:
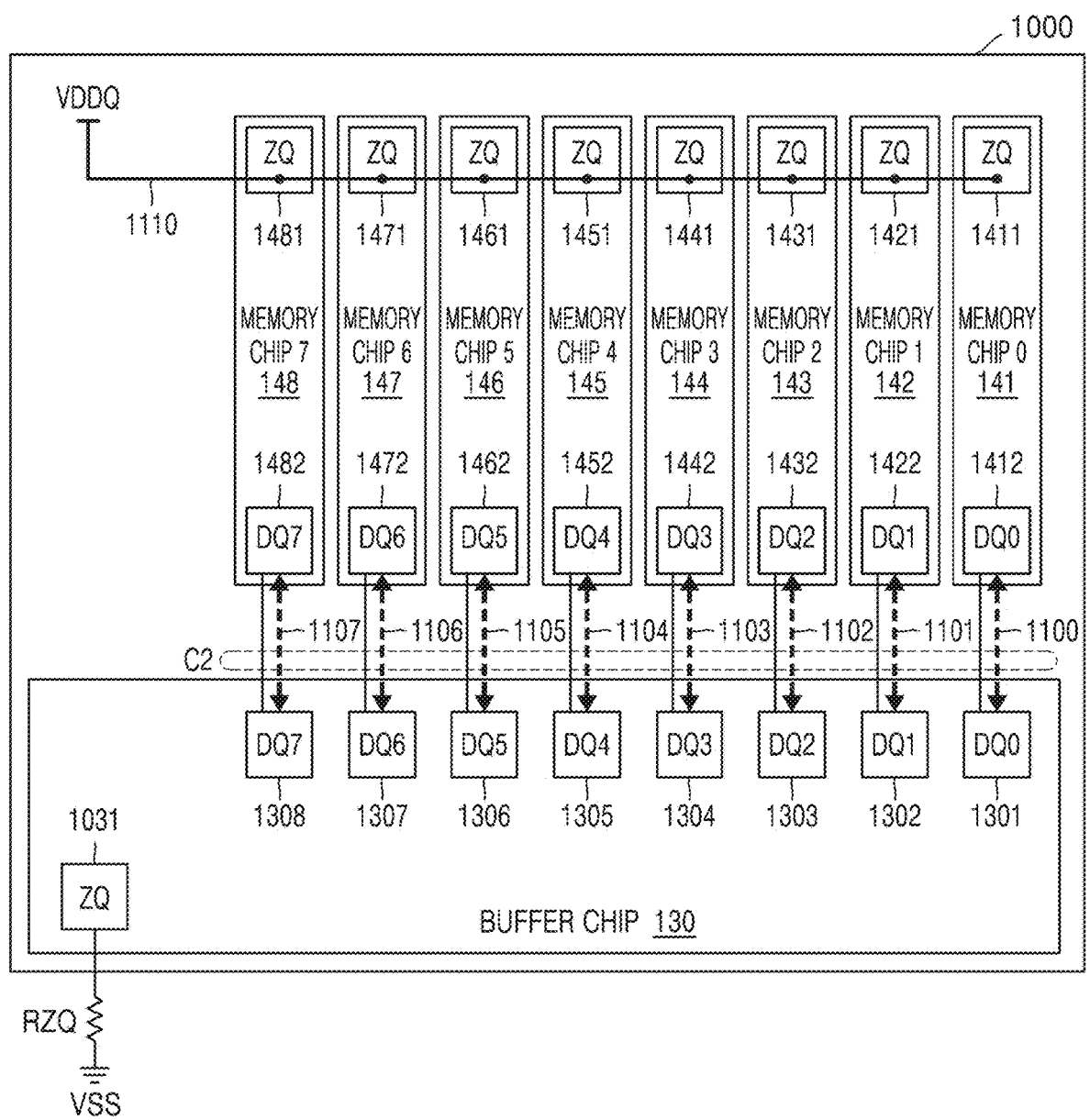
FIG. 11 is a diagram for describing a ZQ calibration method of the multi-chip package of FIG. 10 according to at least one example embodiment of the inventive concepts.

FIG. 11 is a diagram for describing a ZQ calibration method of the multi-chip package 1000 of FIG. 10 according to at least one example embodiment of the inventive concepts.

Referring to FIG. 11, a buffer chip 130 of a multi-chip package 1000 may include the same elements as those of the first memory chip 141 described above with reference to FIG. 4. However, the buffer chip 130 and first to eighth memory chips 141 to 148 may further include a DQ pad DQ7, in addition to DQ pads.

The buffer chip 130 may store a ZQ calibration option, representing each of one-to-one correspondence relationships between the DQ pads of the buffer chip 130 and the DQ pads of the first to eighth memory chips 141 to 148, in a register.

The buffer chip 130 may perform a ZQ calibration operation by using a resistor RZQ connected to a ZQ pad 1031, and termination resistance values of DQ pads 1301 to 1308 of the buffer chip 130 may be controlled and set based on a result obtained by performing the ZQ calibration operation.

When a ZQ calibration operation of the buffer chip 130 ends, each of the first to eighth memory chips 141 to 148 which are slave chips may perform a ZQ calibration operation coupled to a DQ pad of a corresponding slave memory chip by using a termination resistance value set to a corresponding DQ pad of the buffer chip 130. ZQ pads 1411, 1421, 1431, 1441, 1451, 1461, 1471, and 1481 of the first to eighth memory chips 141 to 148 may be connected to a VDDQ voltage line.

A ZQ calibration operation 1100 may be performed between a DQ0 pad 1301 of the buffer chip 130 and a DQ0 pad 1412 of the first memory chip 141 to control termination resistance values of DQ pads DQ0 to DQ7 of the first memory chip 141.

A ZQ calibration operation 1101 may be performed between a DQ1 pad 1302 of the buffer chip 130 and a DQ1 pad 1422 of the second memory chip 142 to control termination resistance values of DQ pads DQ0 to DQ7 of the second memory chip 142.

A ZQ calibration operation 1102 may be performed between a DQ2 pad 1303 of the buffer chip 130 and a DQ2 pad 1432 of the third memory chip 143 to control termination resistance values of DQ pads DQ0 to DQ7 of the third memory chip 143.

A ZQ calibration operation 1103 may be performed between a DQ3 pad 1304 of the buffer chip 130 and a DQ3 pad 1442 of the fourth memory chip 144 to control termination resistance values of DQ pads DQ0 to DQ7 of the fourth memory chip 144.

A ZQ calibration operation 1104 may be performed between a DQ4 pad 1305 of the buffer chip 130 and a DQ4 pad 1452 of the fifth memory chip 145 to control termination resistance values of DQ pads DQ0 to DQ7 of the fifth memory chip 145.

A ZQ calibration operation 1105 may be performed between a DQ5 pad 1306 of the buffer chip 130 and a DQ5 pad 1462 of the sixth memory chip 146 to control termination resistance values of DQ pads DQ0 to DQ7 of the sixth memory chip 146.

A ZQ calibration operation 1106 may be performed between a DQ6 pad 1307 of the buffer chip 130 and a DQ6 pad 1472 of the seventh memory chip 147 to control termination resistance values of DQ pads DQ0 to DQ7 of the seventh memory chip 147.

A ZQ calibration operation 1107 may be performed between a DQ7 pad 1308 of the buffer chip 130 and a DQ7 pad 1482 of the eighth memory chip 148 to control termination resistance values of DQ pads DQ0 to DQ7 of the eighth memory chip 148.

In the present embodiment, it is described that the number of stacked memory chips 141 to 148 of the multi-chip package 1000 is eight and the number of DQ pads DQ0 to DQ7 of the memory chips 141 to 148 is eight. When the number of DQ pads of memory chips is set to n number, n number of memory chips equal to the number of DQ pads may be stacked in the multi-chip package 1000 and ZQ calibration operations of all of the n DQ pads may be performed.

Figure 12:
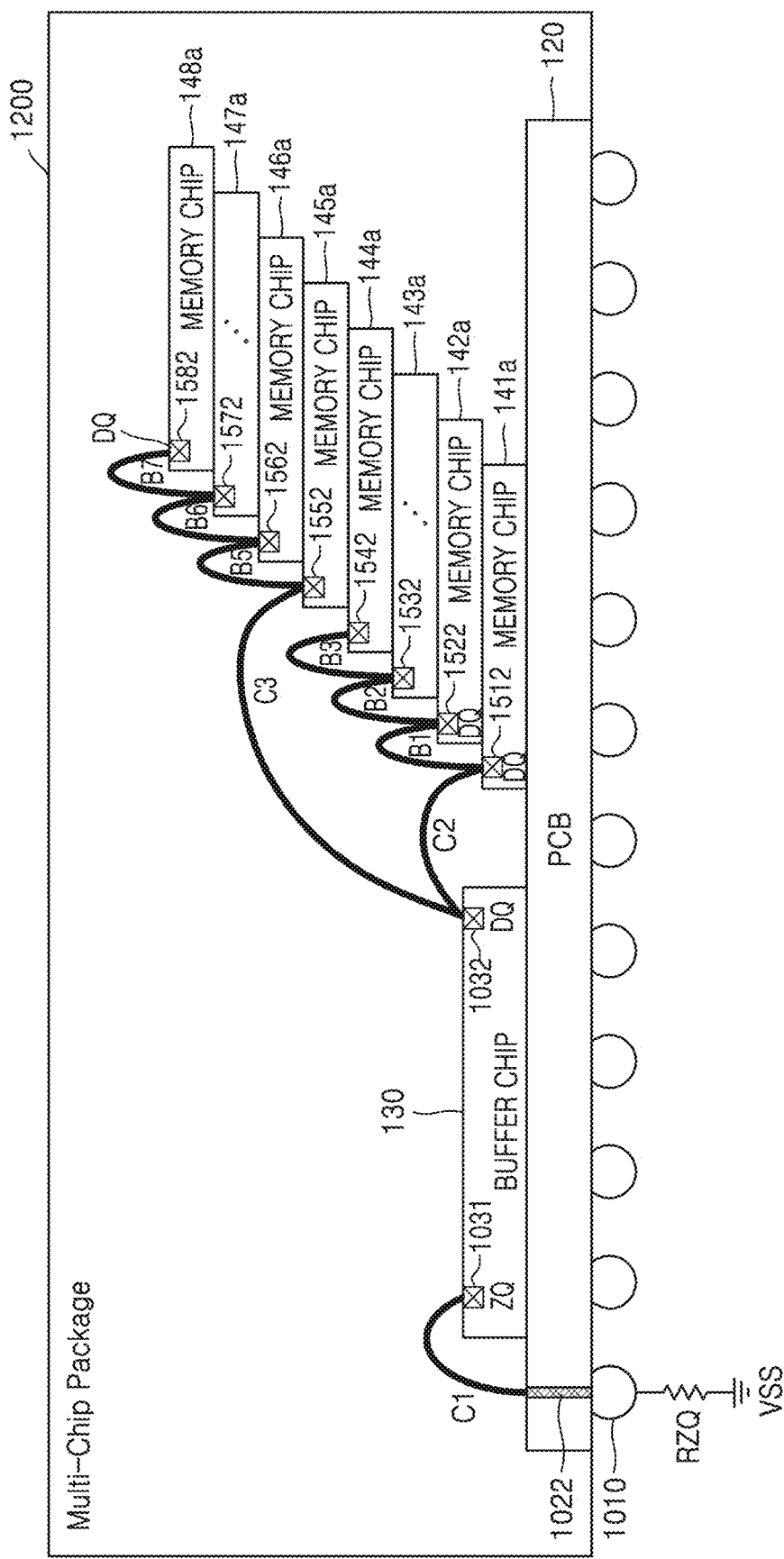
FIG. 12 is a diagram for describing a multi-chip package according to at least one example embodiment of the inventive concepts.

FIG. 12 is a diagram for describing a multi-chip package 1200 according to at least one example embodiment of the inventive concepts.

Referring to FIG. 12, comparing with the multi-chip package 1000 of FIG. 11, the multi-chip package 1200 may have a difference in that a plurality of memory chips 141a to 148a are grouped into a first group and a second group and are connected to a buffer chip 130. Hereinafter, description of the multi-chip package 1200 which is the same as or similar to the descriptions of FIGS. 1 and 11 is omitted.

When the number of stacked memory chips of the multi-chip package 1200 increases, the number of memory chips connected to a DQ pad 1032 of the buffer chip 130 may increase. Due to this, a load of the DQ pad 1032 of the buffer chip 130 may increase, and instability may increase. The load of the DQ pad 1032 may not be suitable for accurate ZQ calibration operations of memory chips connected to the DQ pad 1032 of the buffer chip 130. The load of the DQ pad 1032 of the buffer chip 130 may be controlled to a certain level suitable for the accurate ZQ calibration operations of memory chips.

DQ pads 1512, 1522, 1532, and 1542 of the memory chips 141a to 144a of the first group may be connected to the DQ pad 1032 of the buffer chip 130 through a first bonding wire C2. DQ pads 1552, 1562, 1572, and 1582 of the memory chips 145a to 148a of the second group may be connected to the DQ pad 1032 of the buffer chip 130 through a second bonding wire C3. In the present embodiment, it is described that the plurality of memory chips 141a to 148a are grouped into two groups. However, this is merely an embodiment, and the number of groups is not limited thereto.

The buffer chip 130 may perform a ZQ calibration operation by using a resistor RZQ connected to a ZQ pad 1031, and termination resistance values of the DQ pad 1302 of the buffer chip 130 may be controlled and set based on a result obtained by performing the ZQ calibration operation.

When a ZQ calibration operation of the buffer chip 130 ends, a first ZQ calibration operation of each of the memory chips 141a to 144a of the first group and a second ZQ calibration operation of each of the memory chips 145a to 148a of the second group may be simultaneously performed. In the first ZQ calibration operation, a ZQ calibration operation coupled to a DQ pad of each of the memory chips 141a to 144a of the first group may be performed by using a termination resistance value set to a corresponding DQ pad of the buffer chip 130. In the second ZQ calibration operation, a ZQ calibration operation coupled to a DQ pad of each of the memory chips 145a to 148a of the second group may be performed by using a termination resistance value set to a corresponding DQ pad of the buffer chip 130.

According to at least one example embodiment of the inventive concepts, the ZQ calibration operation of the buffer chip 130 may end, and then, the first ZQ calibration operation of each of the memory chips 141a to 144a of the first group and the second ZQ calibration operation of each of the memory chips 145a to 148a of the second group may be performed in parallel. In other embodiments, the first ZQ calibration operation and the second ZQ calibration operation may be performed sequentially.

Figure 13:
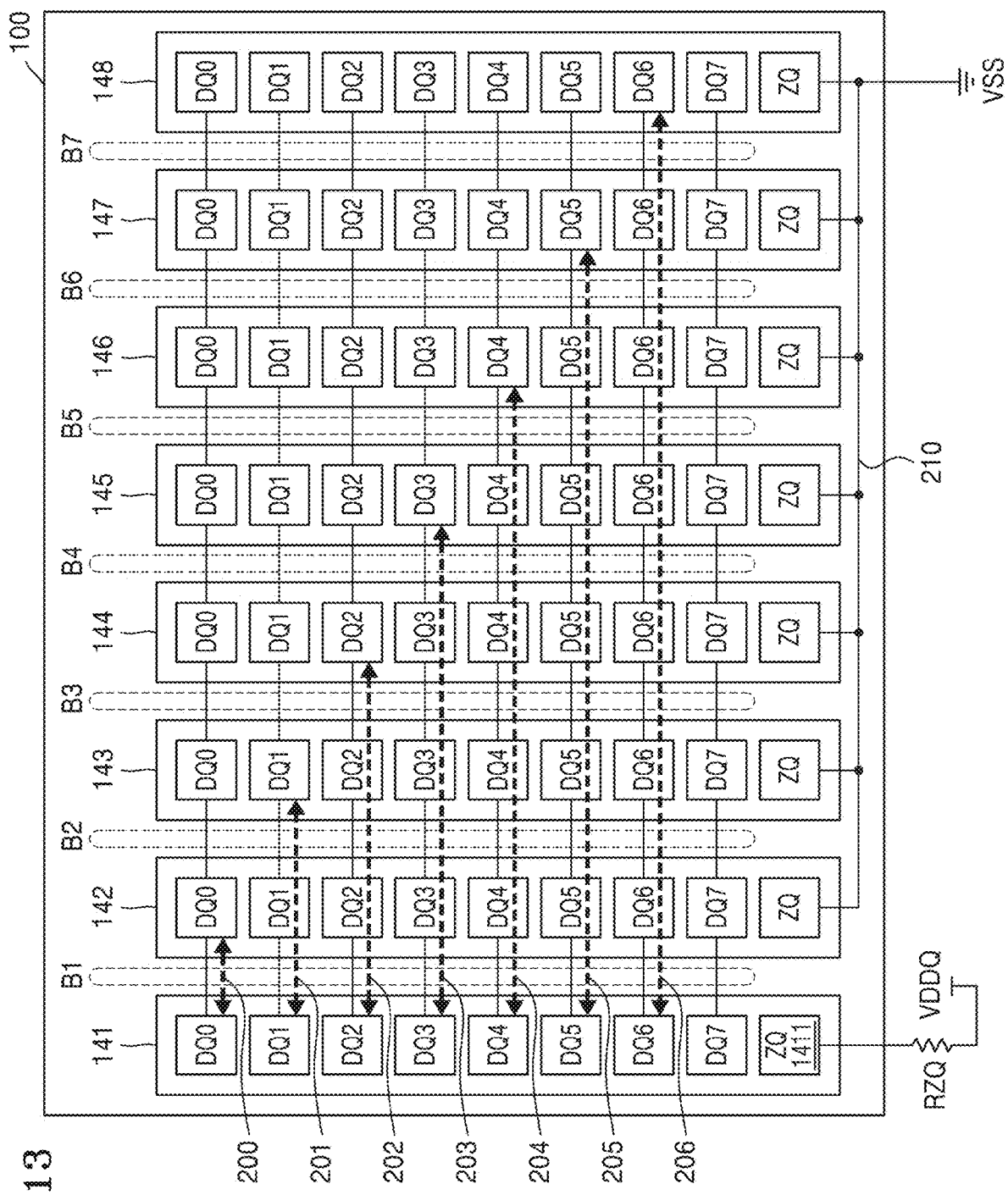
FIG. 13 is a diagram for describing a ZQ calibration method of the multi-chip package of FIG. 1 according to at least one example embodiment of the inventive concepts.

FIG. 13 is a diagram for describing a ZQ calibration method of the multi-chip package 100 of FIG. 1 according to at least one example embodiment of the inventive concepts.

Referring to FIG. 13, comparing with FIG. 2, there may be a difference in that the other end of the resistor RZQ connected to the ZQ pad 1411 of the first memory chip 141 is connected to a source voltage VDDQ line and ZQ pads of the second to eighth memory chips 142 to 148 are connected to the signal line (or ground voltage line) 210 connected to the ground voltage VSS. Hereinafter, description of the multi-chip package 100 which is the same as or similar to the description of FIG. 2 is omitted.

The first memory chip 141 which is a master chip may perform a first ZQ calibration operation by using the resistor RZQ connected to the ZQ pad 1411 to control termination resistance values of the DQ pads DQ0 to DQ6 of the first memory chip 141. Second ZQ calibration operations of slave memory chips may be simultaneously performed based on a ZQ calibration option set between the DQ pads DQ0 to DQ6 of the first memory chip 141 and DQ pads DQ0 to DQ7 of the second to eighth memory chips 142 to 148 which are the slave memory chips.

In the second ZQ calibration operations, the second memory chip 142 which is a first slave memory chip may perform a ZQ calibration operation coupled to the DQ pad DQ0 of the second memory chip 142 by using a termination resistance value of the DQ pad DQ0 of the first memory chip 141 to control termination resistance values of the DQ pads DQ0 to DQ6 of the second memory chip 142. The third memory chip 143 which is a second slave memory chip may perform a ZQ calibration operation coupled to the DQ pad DQ1 of the third memory chip 143 by using a termination resistance value of the DQ pad DQ1 of the first memory chip 141 to control termination resistance values of the DQ pads DQ0 to DQ6 of the third memory chip 143. In this manner, the eighth memory chip 148 which is a seventh slave memory chip may perform a ZQ calibration operation coupled to the DQ pad DQ6 of the eighth memory chip 148 by using a termination resistance value of the DQ pad DQ6 of the first memory chip 141 to control termination resistance values of the DQ pads DQ0 to DQ6 of the eighth memory chip 148.

Figure 14:
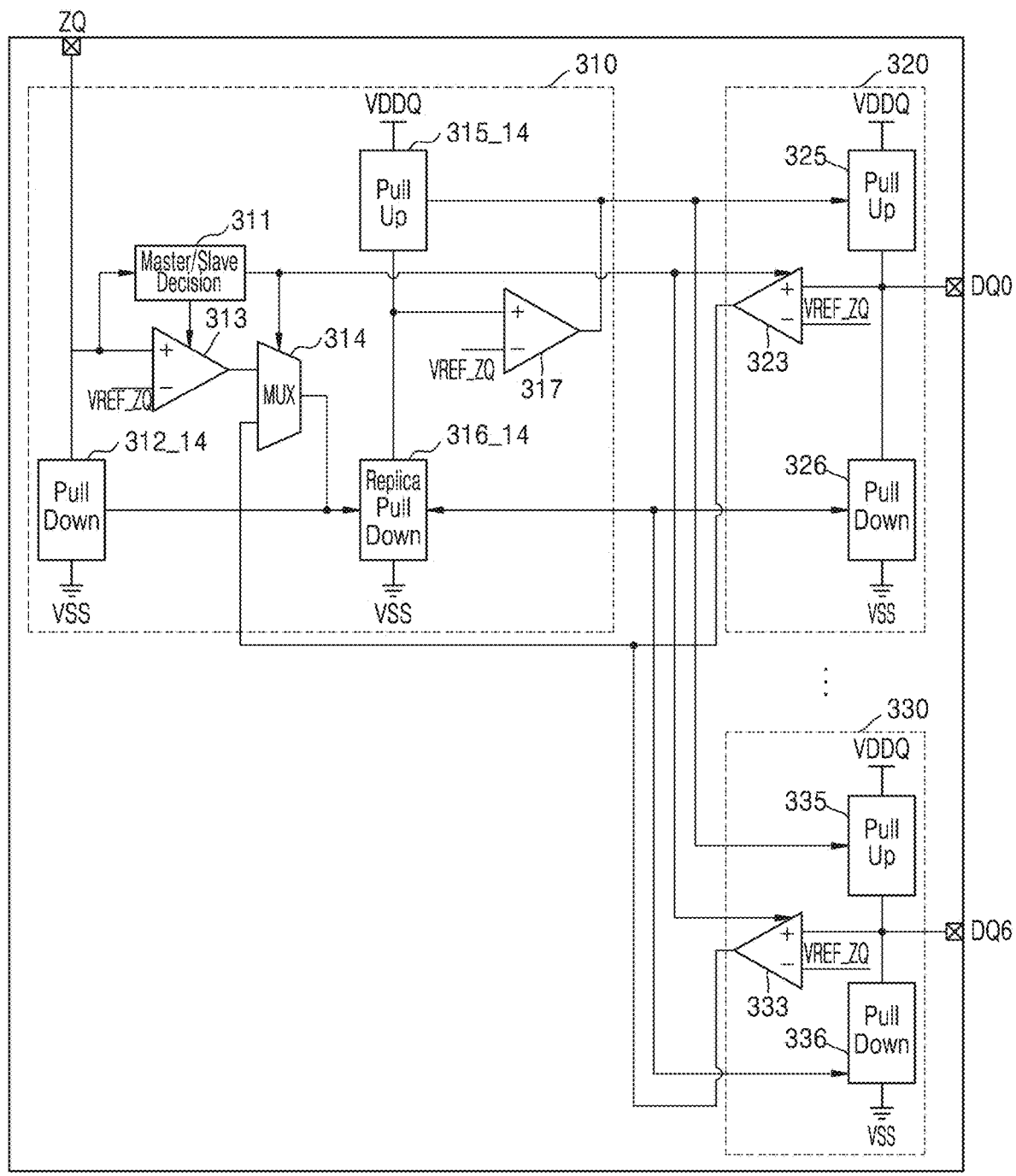
FIG. 14 is a block diagram for describing memory chips of FIG. 13 according to at least one example embodiment of the inventive concepts.

FIG. 14 is a block diagram for describing the memory chips 141 to 148 of FIG. 13 according to at least one example embodiment of the inventive concepts.

Referring to FIG. 14, comparing with FIG. 3, each of the memory chips 141 to 148 may have a difference in that a ZQ engine 310 for performing a pull-up calibration operation and a pull-down calibration operation includes a first pull-down unit 312_14, a pull-up unit 315_14, and a second pull-down unit 316_14, instead of the first pull-up unit 312, the second pull-up unit 315, and the pull-down unit 316. The first pull-down unit 312_14, a pull-up unit 315_14, and a second pull-down unit 316_14 may each be embodied by a circuit or circuitry. Hereinafter, descriptions of the memory chips 141 to 148 which are the same as or similar to the descriptions of FIG. 3 are omitted.

A master/slave determiner 311 may detect a voltage level of a ZQ pad of a corresponding memory chip to determine whether the corresponding memory chip is a master chip or a slave chip. When a voltage level of the ZQ pad is a VSS voltage level (e.g., the ground voltage level), the master/slave determiner 311 may determine the corresponding memory chip as the slave chip. When the voltage level of the ZQ pad is not the VSS voltage level (e.g., the ground voltage level), the master/slave determiner 311 may determine the corresponding memory chip as the master chip. The master/slave determiner 311 may store a ZQ calibration option representing each of one-to-one correspondence relationships 200 to 206 performing a ZQ calibration operation between DQ pads DQ0 to DQ6 of the master chip and the DQ pads DQ0 to DQ6 of the slave chips.

When it is determined by the master/slave determiner 311 that the corresponding memory chip is the master chip, a first comparator 313 may compare a voltage of the ZQ pad with a reference voltage VREF_ZQ. The reference voltage VREF_ZQ may have a voltage level corresponding to half (VDDQ/2) of the VDDQ voltage level (e.g., the source voltage level).

An output of the first comparator 313 may be provided as a first input of a multiplexer 314. An output of each of comparators 323 and 333 of I/O drivers 320 and 330 may be provided as a second input of the multiplexer 314. When it is determined by the master/slave determiner 311 that the corresponding memory chip is the master chip, the multiplexer 314 may output the output of the first comparator 313 input as the first input thereof, and when it is determined by the master/slave determiner 311 that the corresponding memory chip is the slave chip, the multiplexer 314 may output the output of each of the comparators 323 and 333 of the I/O drivers 320 and 330 input as the second input thereof.

The first pull-down unit 312_14 may perform a pull-down calibration operation on the basis of the output of the first comparator 313. The first pull-down unit 312_14 may generate a pull-down calibration code on the basis of the output of the first comparator 313, and in this case, the pull-down calibration operation may be performed by varying the pull-down calibration code until a voltage of the ZQ pad is equal to the reference voltage VREF_ZQ. The first pull-down unit 312_14 may provide the second pull-down unit 316_14 and pull-down units 326 and 336 of the I/O drivers 320 and 330 with the pull-up calibration code at a time when the voltage of the ZQ pad is equal to the reference voltage VREF_ZQ.

The second pull-down unit 316_14 may have substantially the same configuration as that of the first pull-down unit 312_14. An impedance of the second pull-down unit 316_14 may be controlled based on the pull-down calibration code. Therefore, the impedance of the second pull-down unit 316_14 may be substantially the same as that of the first pull-down unit 312_14.

The second comparator 317 may compare the reference voltage VREF_ZQ with a voltage of a connection node between the second pull-down unit 316_14 and the pull-up unit 315_14.

The pull-up unit 315_14 may perform a pull-up calibration operation on the basis of the output of the second comparator 317. The pull-up unit 315_14 may generate a pull-up calibration code on the basis of an output of the second comparator 317, and in this case, a pull-up calibration operation may be performed by varying the pull-up calibration code until the voltage of the connection node between the second pull-down unit 316_14 and the pull-up unit 315_14 is equal to the reference voltage VREF_ZQ. The pull-up unit 315_14 may provide the pull-up units 325 and 335 of the I/O drivers 320 and 330 with the pull-up calibration code at a time when the voltage of the connection node between the second pull-down unit 316_14 and the pull-up unit 315_14 is equal to the reference voltage VREF_ZQ.

The pull-up/pull-down calibration codes generated by the ZQ engine 310 may be provided to the I/O drivers 320 and 330 connected to the DQ pads DQ0 to DQ7, and thus, termination resistance values of the DQ pads DQ0 to DQ7 may be controlled.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A multi-chip package comprising:
a printed circuit board;
a buffer chip on the printed circuit board, the buffer chip including a first impedance control (ZQ) pad and first data input/output (DQ) pads; and
a plurality of memory chips stacked on the printed circuit board and arranged apart from the buffer chip, each of the plurality of memory chips including a second ZQ pad and second DQ pads,
wherein the buffer chip is configured to,
perform a first ZQ calibration operation with respect to the first ZQ pad by using a ZQ resistor connected to the first ZQ pad, and
to control termination resistance values of the first DQ pads of the buffer chip on the basis of a result of the first ZQ calibration operation, and
wherein each of the plurality of memory chips is configured to perform second ZQ calibration operations with respect to the second DQ pads of a corresponding memory chip from among the plurality of memory chips by using a termination resistance value of a corresponding DQ pad of the buffer chip on the basis of a ZQ calibration option set between the first DQ pads of the buffer chip and the second DQ pads of the corresponding memory chip.

2. The multi-chip package of claim 1, wherein the plurality of memory chips are configured to perform the second ZQ calibration operations simultaneously.

3. The multi-chip package of claim 2, wherein a time for completing the second ZQ calibration operations performed by the plurality of memory chips is shorter than two times a time for completing the second ZQ calibration operation performed by one of the plurality of memory chips.

4. The multi-chip package of claim 1, wherein the second ZQ pad of each of the plurality of memory chips is connected to a source voltage line or a ground voltage line.

5. The multi-chip package of claim 1, wherein
the first DQ pads of the buffer chip are respectively connected to the second DQ pads of each of the plurality of memory chips.

6. The multi-chip package of claim 1, wherein
the ZQ calibration option is stored in a register of the buffer chip.

7. An impedance control (ZQ) calibration method of a multi-chip package including a plurality of memory chips, the ZQ calibration method comprising:
performing a first ZQ calibration operation with respect to a ZQ pad of a buffer chip by using a ZQ resistor connected to a ZQ terminal of the multi-chip package in the buffer chip of the multi-chip package;
controlling termination resistance values of data input/output (DQ) pads of the buffer chip on the basis of a result of the first ZQ calibration operation in the buffer chip; and
performing second ZQ calibration operations with respect to DQ pads of a corresponding memory chip by using a termination resistance value of a corresponding DQ pad of the buffer chip on the basis of a ZQ calibration option set between the DQ pads of the buffer chip and the DQ pads of the corresponding memory chip in each of the plurality of memory chips.

8. The ZQ calibration method of claim 7, further comprising storing the ZQ calibration option in a register of the buffer chip.

9. The ZQ calibration method of claim 7, further comprising storing the ZQ calibration option in a register of each of the plurality of memory chips.

10. The ZQ calibration method of claim 7, wherein
the second ZQ calibration operations performed by the plurality of memory chips are simultaneously performed.

11. The ZQ calibration method of claim 10, wherein
a time for completing the second ZQ calibration operations performed by the plurality of memory chips is shorter than two times a time for completing the second ZQ calibration operation performed by one of the plurality of memory chips.

12. The ZQ calibration method of claim 7, wherein
the ZQ pad of each of the plurality of memory chips is connected to a source voltage line or a ground voltage line.

13. The ZQ calibration method of claim 7, wherein
the performing of the second ZQ calibration operations comprises performing the second ZQ calibration operation by each of memory chips of a first group among the plurality of memory chips in parallel with performing the second ZQ calibration operation by each of memory chips of a second group among the plurality of memory chips.

14. The ZQ calibration method of claim 7, wherein
the performing of the second ZQ calibration operations comprises sequentially performing the second ZQ calibration operation by each of memory chips of a first group among the plurality of memory chips and the second ZQ calibration operation by each of memory chips of a second group among the plurality of memory chips.

* * * * *